US012615889B2

(12) United States Patent
Bower et al.

(10) Patent No.: US 12,615,889 B2
(45) Date of Patent: Apr. 28, 2026

(54) CONNECTION-POST STRUCTURES

(71) Applicant: Daktronics, Inc., Brookings, SD (US)

(72) Inventors: Christopher Andrew Bower, Raleigh, NC (US); Matthew Alexander Meitl, Durham, NC (US); Ronald S. Cok, Rochester, NY (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 16/918,808

(22) Filed: Jul. 1, 2020

(65) Prior Publication Data

US 2021/0343903 A1      Nov. 4, 2021

Related U.S. Application Data

(60) Provisional application No. 63/019,961, filed on May 4, 2020.

(51) Int. Cl.
| | |
|---|---|
| *H10H 20/831* | (2025.01) |
| *H10H 20/857* | (2025.01) |
| *H10H 20/01* | (2025.01) |

(52) U.S. Cl.
CPC ........ *H10H 20/831* (2025.01); *H10H 20/857* (2025.01); *H10H 20/032* (2025.01); *H10H 20/0364* (2025.01)

(58) Field of Classification Search
CPC .. H10H 20/831; H10H 20/857; H10H 20/032; H10H 20/0364
See application file for complete search history.

(56) References Cited

U.S. PATENT DOCUMENTS

| | | | |
|---|---|---|---|
| 7,622,367 | B1 | 11/2009 | Nuzzo et al. |
| 7,943,491 | B2 | 5/2011 | Nuzzo et al. |
| 8,506,867 | B2 | 8/2013 | Menard |
| 8,722,458 | B2 | 5/2014 | Rogers et al. |
| 8,889,485 | B2 | 11/2014 | Bower |
| 9,520,537 | B2 | 12/2016 | Bower et al. |
| 9,603,259 | B2 | 3/2017 | Bower |
| 10,103,069 | B2 | 10/2018 | Bower et al. |
| 10,153,256 | B2 | 12/2018 | Cok et al. |

(Continued)

OTHER PUBLICATIONS

Cok, R. S. et al., Inorganic light-emitting diode displays using micro-transfer printing, Journal of the SID, 25(10):589-609, (2017).

*Primary Examiner* — Su C Kim
(74) *Attorney, Agent, or Firm* — Schwegman Lundberg & Woessner, P.A.

(57) ABSTRACT

A transfer-print component structure comprises a component having a component first side and an opposing component second side, and a single electrode disposed on the component first side. The single electrode is the only electrode disposed on the component first side. One or more stabilizing connection posts are disposed on the first side and extend away from the component. Each of the one or more stabilizing connection posts is electrically conductive and is electrically connected in common to the single electrode. In some embodiments, the one or more stabilizing connection posts comprise at least three distal portions disposed at three spatially separated locations that are not in a common line. A printed structure comprises a destination substrate with a contact pad with at least one stabilizing connection post is in electrical contact the contact pad.

24 Claims, 18 Drawing Sheets

(56)     References Cited

U.S. PATENT DOCUMENTS

| | | | |
|---|---|---|---|
| 10,222,698 B2 | 3/2019 | Prevatte et al. | |
| 10,224,231 B2 | 3/2019 | Bower et al. | |
| 10,224,460 B2 | 3/2019 | Bower et al. | |
| 10,395,966 B2 | 8/2019 | Bower et al. | |
| 10,468,363 B2 | 11/2019 | Prevatte et al. | |
| 10,777,521 B2 | 9/2020 | Meitl et al. | |
| 11,064,609 B2 | 7/2021 | Cok | |
| 11,101,417 B2 | 8/2021 | Bower et al. | |
| 11,276,657 B2 | 3/2022 | Prevatte et al. | |
| 11,495,560 B2 | 11/2022 | Prevatte et al. | |
| 2002/0153608 A1* | 10/2002 | Okada | H01L 24/81 257/737 |
| 2012/0313241 A1* | 12/2012 | Bower | H01L 24/13 257/737 |
| 2013/0193464 A1* | 8/2013 | Bae | H01L 33/405 257/94 |
| 2013/0221372 A1* | 8/2013 | Lee | H01L 33/36 438/22 |
| 2016/0093600 A1 | 3/2016 | Bower et al. | |
| 2016/0116796 A1* | 4/2016 | Kim | G02F 1/133514 445/24 |
| 2016/0336488 A1* | 11/2016 | Bower | H01L 33/007 |
| 2017/0047303 A1* | 2/2017 | Meitl | H05K 3/3436 |
| 2017/0047306 A1* | 2/2017 | Meitl | H01L 21/6835 |
| 2017/0133550 A1* | 5/2017 | Schuele | H01L 25/167 |
| 2017/0256522 A1* | 9/2017 | Cok | H01L 25/0753 |
| 2018/0033853 A1* | 2/2018 | Bower | H10K 59/35 |
| 2018/0219123 A1* | 8/2018 | Wang | H01L 27/15 |
| 2020/0105697 A1 | 4/2020 | Prevatte et al. | |
| 2021/0280506 A1 | 9/2021 | Oswalt et al. | |

* cited by examiner

CONNECTION-POST STRUCTURES

PRIORITY APPLICATION

This application claims the benefit of U.S. Provisional Patent Application No. 63/019,961, filed on May 4, 2020, the disclosure of which is hereby incorporated by reference herein in its entirety.

CROSS REFERENCE TO RELATED APPLICATIONS

Reference is made to U.S. Pat. No. 9,603,259, filed Aug. 7, 2015, entitled Methods for Surface Attachment of Flipped Active Components, U.S. Pat. No. 10,468,363, filed Aug. 10, 2015, entitled Chiplets with Connection Posts, by Prevatte et al., to U.S. patent application Ser. No. 16/543,015, filed Aug. 16, 2019, entitled Chiplets with Connection Posts, by Prevatte et al., to U.S. patent application Ser. No. 16/702,398, filed Dec. 3, 2019, entitled Chiplets with Connection Posts, by Prevatte et al., to U.S. patent application Ser. No. 16/778,964, filed Jan. 31, 2020, entitled Chiplets with Connection Posts, by Prevatte et al., and to U.S. patent application Ser. No. 14/823,917, filed Aug. 11, 2015, entitled Printable Component Structure with Electrical Contact, by Meitl et al., the contents of each of which are incorporated by reference herein in their entirety.

TECHNICAL FIELD

The present disclosure relates to components with electrical connection posts useful for electrical connections made by transfer printing.

BACKGROUND

Substrates with electronically active components distributed over the extent of the substrate are used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating one or more layers of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Components transfer printed on a destination substrate can be electrically connected using conventional photolithographic methods and materials to form wires that extend over the destination substrate and onto the printed components. Another set of methods for electrically connecting transfer-printed components include using a connection post formed on each of two electrodes on the component and electrically connected to a circuit in the component, for example as taught in U.S. Pat. No. 9,603,259 to provide a complete electrical circuit. U.S. Pat. No. 10,468,363 illustrates components with two electrodes and two electrically connected connection posts formed on each of the two electrodes and a substrate with four connection posts. U.S. Patent Publication No. 2017/0047303 discloses an LED with a top electrical contact and multiple bottom contacts. U.S. Pat. No. 10,224,231 illustrates components with orientation-compensating connection posts to suitably oriented transfer-printed components.

There remains an on-going need for making robust mechanical and electrical connections to a variety of transfer-print components.

SUMMARY

Embodiments of the present disclosure are addressed to connection post structures for micro-transfer printed components that provide mechanical stability and robust electrical connections when exposed to pressure from curing, flowing, or reflowing materials, such as adhesives and planarization layers.

According to some embodiments of the present disclosure, a transfer-print component structure comprise a component having a component first side and an opposing component second side, a single electrode disposed on the component first side, wherein the single electrode is the only electrode disposed on the component first side, and one or more stabilizing connection posts disposed on the first side and extending away from the component, wherein each of the one or more stabilizing connection posts is electrically conductive and is electrically connected in common to the single electrode.

In some embodiments, the one or more stabilizing connection posts comprise at least three distal portions disposed at three spatially separated locations that are not in a common line. One stabilizing connection post of the one or more stabilizing connection posts can comprise three of the three spatially separated locations, one stabilizing connection post of the one or more stabilizing connection posts can comprise two of the three spatially separated locations, or three stabilizing connection posts of the one or more stabilizing connection posts can each comprise one of the three spatially separated locations. One or more distal portions of the three distal portions can be closer to an edge of the component first side than to a center of the component first side. The one or more stabilizing connection posts can comprise a stabilizing connection post that is a linear rail, a curved rail, or a ring. The one or more stabilizing connection posts can comprise a stabilizing connection post having a sharp distal end area smaller than a proximal end area of the stabilizing connection post. The one or more stabilizing connection posts can comprise a stabilizing connection post having a distal end with a distal length and a distal width, where the distal length is substantially the same as the distal width. The one or more stabilizing connection posts can comprise a stabilizing connection post having a flat distal end surface. The one or more stabilizing connection posts can comprise two or more stabilizing connection posts having distal ends that terminate in a common plane. Each distal end of the distal ends that terminate in a common plane can be substantially a point (e.g., having a radius of curvature of less than 5 microns), each distal end of the distal ends that terminate in a common plane can be substantially a plane, or at least one distal end of the distal ends that terminate in a common plane can be substantially a point and at least one distal end of the distal ends that terminate in a common plane can be substantially a plane.

According to some embodiments of the present disclosure, the component comprises a vertical LED or the transfer-print component structure is a vertical LED.

In some embodiments, the single electrode substantially covers the component first side.

In some embodiments, the transfer-print component structure comprises at least a portion of a tether physically connected to the component, for example a separated, fractured, or broken tether.

In some embodiments, every stabilizing connection post extending from the first side of the component can be commonly electrically connected to the single electrode. In some embodiments, the transfer-print component structure comprises one or more separate stabilizing connection posts disposed on the component first side and extending from the component electrically disconnected from the single electrode. In some embodiments, the one or more separate stabilizing connection posts are disposed around a perimeter of the single electrode or the component first side or at least one separate stabilizing connection post of the one or more separate stabilizing connection posts is closer to an edge of the single electrode or the component first side than at least one stabilizing connection post of the one or more stabilizing connection posts electrically connected in common to the single electrode.

According to some embodiments of the present disclosure, a transfer-printed structure comprises a destination substrate and at least one contact pad disposed on or in the destination substrate. One or more transfer-print component structures are disposed on or over the destination substrate. At least one of the one or more stabilizing connection posts is in electrical contact with one of the at least one contact pads. In some embodiments, all of the one or more stabilizing connection posts are in electrical contact with one of the at least one contact pads.

According to some embodiments, an adhesive layer is disposed at least partially between the component and one contact pad of the at least one contact pads. At least one stabilizing connection post of the one or more stabilizing connection posts extends through the adhesive layer. According to some embodiments, the component has one or more component walls extending away from the destination substrate and the adhesive layer is at least partially in contact with at least a portion of at least one component wall of the one or more component walls. The adhesive layer can be disposed in a patterned layer or the adhesive layer can be a planarization layer.

According to some embodiments, the component has one or more component walls extending away from the destination substrate and the transfer-printed structure comprises a planarization layer disposed on or over the destination substrate that is at least partially in contact with at least a portion of at least one component wall of the one or more component walls. The planarization layer can extend to the component second side. The planarization layer can cover only a portion and less than all of the component second side.

According to some embodiments of the present disclosure, the components are or comprise a vertical LED or the transfer-print component structures are or comprise vertical LEDs. In some embodiments, a second electrode is disposed on the component second side of each of the one or more transfer-print component structures. According to some embodiments, the one or more transfer-print component structures comprises a first transfer-print component structure and a second transfer-print component structure and the transfer-printed structure comprises a common electrode disposed over the destination substrate that is in electrical contact with the second electrode of the first transfer-print component structure and in electrical contact with the second electrode of the second transfer-print component structure. In some embodiments, the common electrode contacts a planarization layer disposed between the one or more transfer-print component structures. In some embodiments, the common electrode directly contacts the component without a second electrode, or the second electrode comprises or is the same material as the common electrode. The common electrode can comprise an array of wires disposed laterally between the transfer-print components directly on the planarization layer or on the common electrode, or both (below the common electrode or above the common electrode, or both). If the wires are formed on the planarization layer, the common electrode can be made in a common layer and in a common processing step with the second electrode.

According to some embodiments of the present disclosure, a method of making a transfer-print component structure comprises providing a source substrate, disposing a component on the source substrate, and disposing only a single electrode and one or more stabilizing connection posts extending away from the source substrate on a side of the component opposite the source substrate. Each of the one or more stabilizing connection posts is electrically conductive and is electrically connected in common to the single electrode. The component can be formed on the source substrate and the component can be native to the source substrate.

According to some embodiments, methods of the present disclosure comprise disposing a release layer over the component, the electrode, and the one or more stabilizing connection posts, adhering the release layer to a handle substrate after disposing the release layer, removing the native source substrate after adhering the release layer to a handle substrate to form an exposed side of the component, disposing a second electrode on the exposed side of the component, and removing the release layer to release the component from the handle substrate after removing the native source substrate so that the component remains connected to the source substrate only by one or more tethers. Methods of the present disclosure can comprise providing a destination substrate with a contact pad disposed on the destination substrate and transfer printing the component to the destination substrate from the handle substrate by pressing the one or more stabilizing connection posts into electrical contact with the contact pad.

In some embodiments, methods comprise providing an adhesive layer on the destination substrate and contact pad and pressing the one or more stabilizing connection posts through the adhesive layer into electrical contact with the contact pad. In some embodiments, methods comprise disposing a planarizing layer (a planarization layer) over the destination substrate leaving a portion of the component or the second electrode exposed. In some embodiments, methods comprise disposing a common electrode in electrical contact with the second electrode or the component. Wires can be disposed on the planarization layer or on the common electrode laterally between the transfer-print component structures to enhance the conductivity of the common electrode without obscuring any light output from the transfer-print component structures through the common electrode. The wires can be formed on the planarization layer at the same time as and in a common processing step with the second electrode on the component.

According to some embodiments of the present disclosure, a wafer structure comprises a source substrate and an array of transfer-print component structures disposed laterally over the source substrate. The components of the transfer-print component structures can be native to the source substrate. A release layer can be disposed on the plurality of components on a side of the components opposite the source substrate and a handle substrate can bond to at least a portion of the release layer.

According to some embodiments of the present disclosure a wafer structure comprises an array of transfer-print component structures, a release layer disposed over the array of transfer-print component structures, and a handle substrate bonded to at least a portion of the release layer. The release layer can comprise a differentially etchable material or a gap from which the material is etched and each component structure of the array of transfer-print component structures can be attached to the handle substrate with a tether connected to at least one anchor. In some embodiments, for each of the transfer-print component structures, at least one anchor is disposed laterally between the transfer-print component structures and at least one tether laterally connects the transfer-print component structures to the at least one anchor. In some embodiments, for each of the transfer-print component structures, at least one anchor is disposed between the transfer-print component structures and the handle substrate and at least one tether connects each transfer-print component structure to the at least one anchor, so that the tether is between the transfer-print component structure and the handle substrate.

According to some embodiments of the present disclosure, a transfer-print component structure comprises a component, an electrode disposed on a side of the component, and stabilizing connection posts extending away from the side of the component. The stabilizing connection posts can comprise a first stabilizing connection post that is a rail and a second stabilizing connection post that is a polygonal solid. Each of the stabilizing connection posts can be electrically conductive and commonly electrically connected to the electrode. The first stabilizing connection post and the second stabilizing connection post can be the only stabilizing connection posts that extend from the side of the component.

According to some embodiments of the present disclosure, a transfer-print component structure comprises a component, an electrode disposed on a side of the component, and stabilizing connection posts extending away from the side of the component. Each of the stabilizing connection posts can be electrically conductive and commonly electrically connected to the electrode and the stabilizing connection posts can comprise at least three stabilizing connection posts each having at least a portion, for example a distal end or a distal portion, that is closer to an edge of the side of the component than to a center of the side of the component.

Certain embodiments of the present disclosure disclose methods, structures, and materials for a micro-transfer printed structure that is resistant to pressure, for example pressure due to the curing, flow, or re-flow of adhesives or planarization layers, or both, in contact with the micro-transfer-printed structure.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figures 1A, 1B:
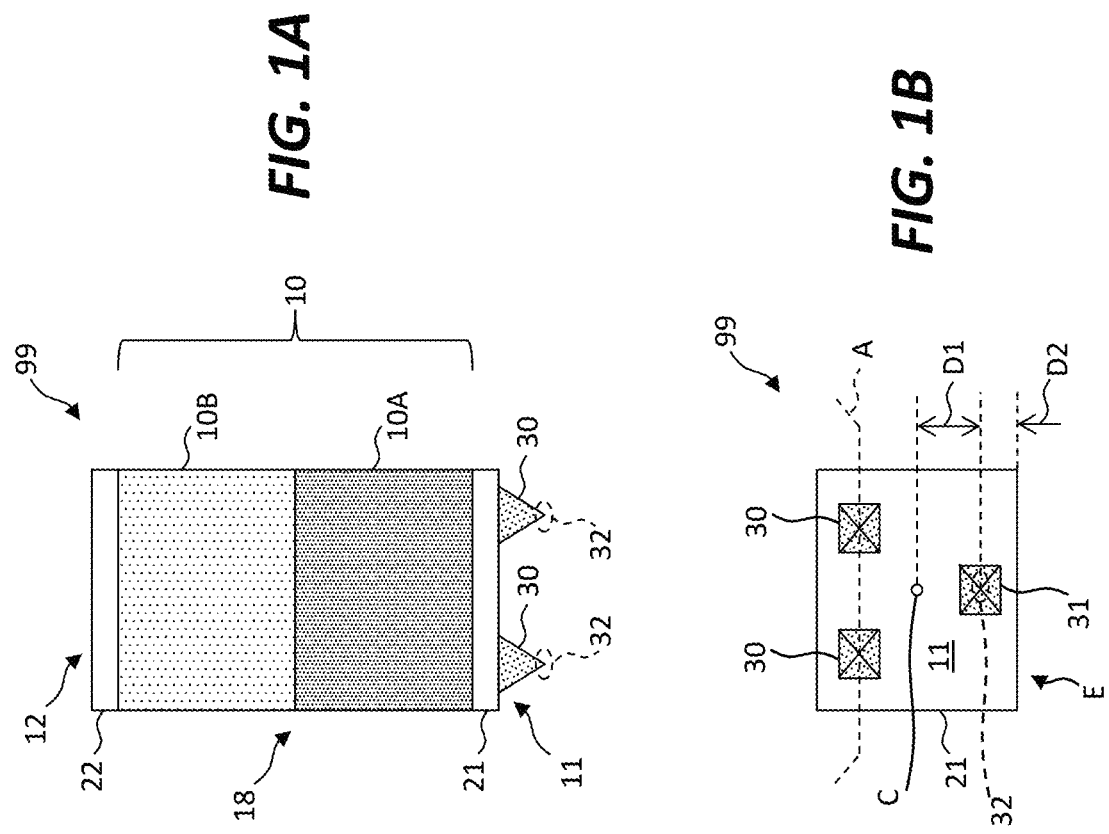
FIG. 1A is a cross section taken across cross section line A of FIGS. 1B and 1C according to illustrative embodiments of the present disclosure.
FIG. 1B is a plan view indicating cross section line A according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward transfer-print components, structures, and methods of making and transfer printing (e.g., micro-transfer printing) printable components or structures from a source wafer onto a target or destination substrate forming printed components or structures. Transfer printing is a process of removing components from a source wafer (e.g., a native source wafer on which the components are constructed) and transferring them to a non-native destination substrate using a stamp. As used herein, a "transfer-print component structure" can comprise a printable component that is not yet printed or a printed component that has been printed. Transfer-print component structures can be printable (before printing) or printed (after printing). Printable or printed components or structures of the present disclosure can provide a robust mechanical structure that provides mechanical stability and resists movement once printed, as well as providing a simple and inexpensive electrical connection in the same transfer-print process. The robust mechanical structure can be provided by one or more stabilizing connection posts that firmly and robustly affix the transfer-print component structure to a destination substrate despite forces applied to the printed transfer-print component structure, for example by (e.g., during) curing, wicking, or other reflow of adhesive or planarizing materials in contact with the printed transfer-print component structure.

Figure 1C:
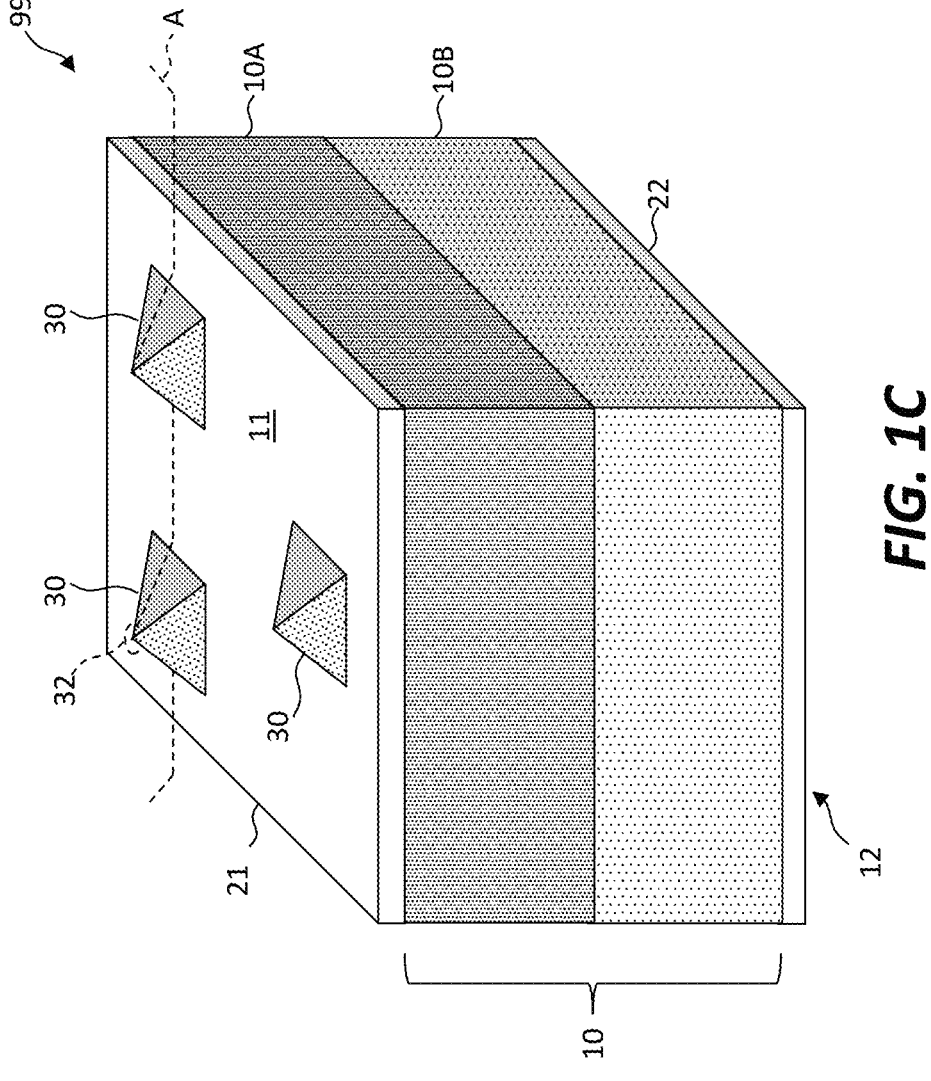
FIG. 1C is a perspective indicating cross section line A according to illustrative embodiments of the present disclosure and is inverted in presentation with respect to FIG. 1A.

Referring to the cross section of FIG. 1A, the plan view of FIG. 1B, and the perspective of FIG. 1C, a transfer-print component 99 comprises a component 10 having a component first side 11 and an opposing component second side 12. Component 10 can have multiple layers, e.g., first component layer 10A and second component layer 10B. First and second component layers 10A, 10B can be semiconductor layers, for example doped semiconductor layers, such as n-doped or p-doped compound semiconductor layers. Component 10 can be a semiconductor device, for example a light-emitting diode (LED), integrated circuit, or electrical conductor. Only a single electrode 21 is disposed on component first side 11 so that single electrode 21 is the only electrode disposed on component first side 11. Single electrode 21 is also referred to as first electrode 21. A second electrode 22 can be disposed on component second side 12. Second electrode 22 can also be, but is not necessarily, a single electrode. Thus, component 10 can be a vertical two-connection electrical device, with electrodes disposed on the top (component second side 12) and on the bottom (component first side 11) of component 10. (It will be understood by those knowledgeable in the art that top and bottom are arbitrary designations and can be exchanged, for example transfer-print component structure 99 in FIG. 1A is shown inverted from the same transfer-print component structure of FIG. 1C and therefore the designations of top and bottom are similarly exchanged between FIGS. 1A and 1C.) First and second electrode 21, 22 materials can be chosen to facilitate the conduction of electrical current through first component layer 10A and second component layer 10B, respectively, for example materials suitable, or optimized, for conducting current to a p-doped or n-doped semiconductor material. First and second electrode 21, 22 can be or comprise the same, or different, electrically conductive materials.

One or more stabilizing connection posts 30 are disposed on component first side 11 and extend away from component 10 so that stabilizing connection posts 30 extend (e.g., stick out, protrude, or point away) from component 10. Each stabilizing connection post 30 is electrically conductive, for example comprising a solid electrical conductor or has an electrically conductive surface, such as a metal disposed over a dielectric structure. Each stabilizing connection post 30 can be electrically connected in common to single electrode 21, so that all of one or more stabilizing connection posts 30 are electrically connected together in common to form one conductor. In some embodiments, the surfaces of one or more stabilizing connection posts 30 can be a part of first electrode 21, can comprise first electrode 21, or can be electrically connected to first electrode 21.

One or more stabilizing connection posts 30 can comprise one or more distal ends with spatially separated distal portions 32 disposed at three (or more) spatially separated locations that are not in a common line and are not collinear. Distal portions 32 can be a portion of a distal end of a stabilizing connection post 30 so that the spatially separated distal portions 32 can form a stable structural and physical contact to a surface, for example a planar surface. As an example, one stabilizing connection post 30 can have a distal end with three or more spatially separated locations that are not in a common line and are not collinear, for example can have a circular cross section. As another example, multiple stabilizing connection posts 30 can each have a distal end that together do not lie on a common line and are not collinear, for example can each be a point. It can be difficult to construct a completely planar surface on which transfer-print component structure 99 can rest and it is likewise difficult to make a completely planar component first side 11 so that, in the absence of stabilizing connection posts 30 of the present disclosure, it can be difficult to firmly dispose and electrically connect transfer-print component structure 99 on a surface such as a glass or plastic destination substrate, semiconductor wafer, or printed circuit board.

Distal ends of stabilizing connection posts 30 can be a point (e.g., within the limitations of a manufacturing process), a plane, or a line (either straight or curved) (e.g., a sharp edge), or a combination thereof. Distal ends of stabilizing connection posts 30 can be either sharp or flat. According to some embodiments, transfer-print component structure 99 comprises at least one of one stabilizing connection post 30 with a distal end that comprises three spatially separated distal portions 32, one stabilizing connection post 30 with a distal end that comprises two spatially separated distal portions 32, and three separate stabilizing connection posts 30 that each comprises a distal end that is one of three spatially separated distal portions 32.

In the embodiment of FIG. 1A-1C, three stabilizing connection posts 30 are pyramidal structures extending (e.g., sticking out, protruding, or pointing away) from component first side 11 of component 10 that are covered with an electrical conductor, such as a metal, for example aluminum, that is electrically common with, or comprises a portion of, first electrode 21. Distal portions 32 (points in this case) of the three stabilizing connection posts 30 are spatially separated over component first side 11 and in a common plane, so that when the three stabilizing connection posts 30 of component 10 contact a surface, all three distal portions 32 will contact the surface at the same time. Moreover, distal portions 32 of the three stabilizing connection posts 30 of FIGS. 1A-1C are not all in a common line and are therefore non-collinear.

All of one or more of stabilizing connection posts 30 or distal ends (e.g., distal portions 32 of distal ends) of one or more of stabilizing connection posts 30 can be closer to an edge E of component 10 than a center C of component 10, for example as shown in FIG. 1B. In some embodiments, all of each distal end is closer to an edge E of component 10 than to a center C of component 10. In some embodiments, a distal portion 32 is closer to an edge E of component 10 than to a center C of component 10. In some embodiments, a portion of each stabilizing connection post 30 is closer to an edge E of component 10 than to a center C of component 10. In some embodiments, all of each stabilizing connection post 30 is closer to an edge E of component 10 than to a center C of component 10. As shown in FIG. 1B, distal portion 32 of first stabilizing connection post 31 is a distance D1 from center C greater than distance D2 from an edge, thus providing a stable structure able to withstand forces applied to component 10 or transfer-print component structure 99.

According to some embodiments of the present disclosure, any one or more of stabilizing connection posts 30 can be a pyramid, a tetrahedron, a linear rail, a curved rail, or a ring. A ring can be a circular ring, such as a torus, an oval, an ellipse, a rectangle, a square, or polygon, or, in general, any simple closed curve. A distal end or distal portion 32 of a stabilizing connection post 30 can be a point, can be flat, or can be a ridge (e.g. a sharp ridge or line, either curved or straight, for example formed by the intersection of two planes).

Figures 2A, 2B:
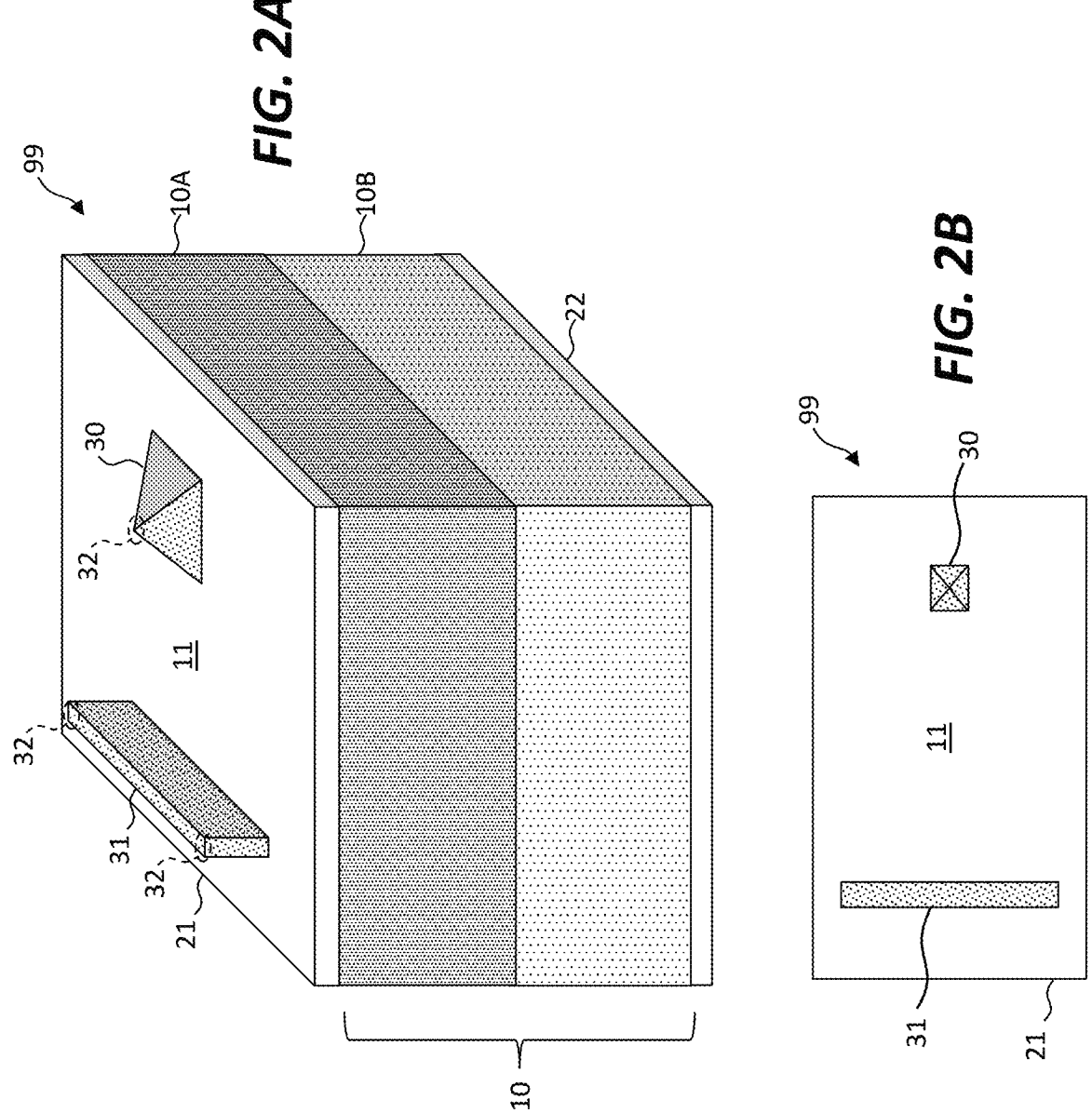
FIG. 2A is a perspective according to illustrative embodiments of the present disclosure.
FIG. 2B is a plan view corresponding to FIG. 2A according to illustrative embodiments of the present disclosure.
Figures 3A, 3B:
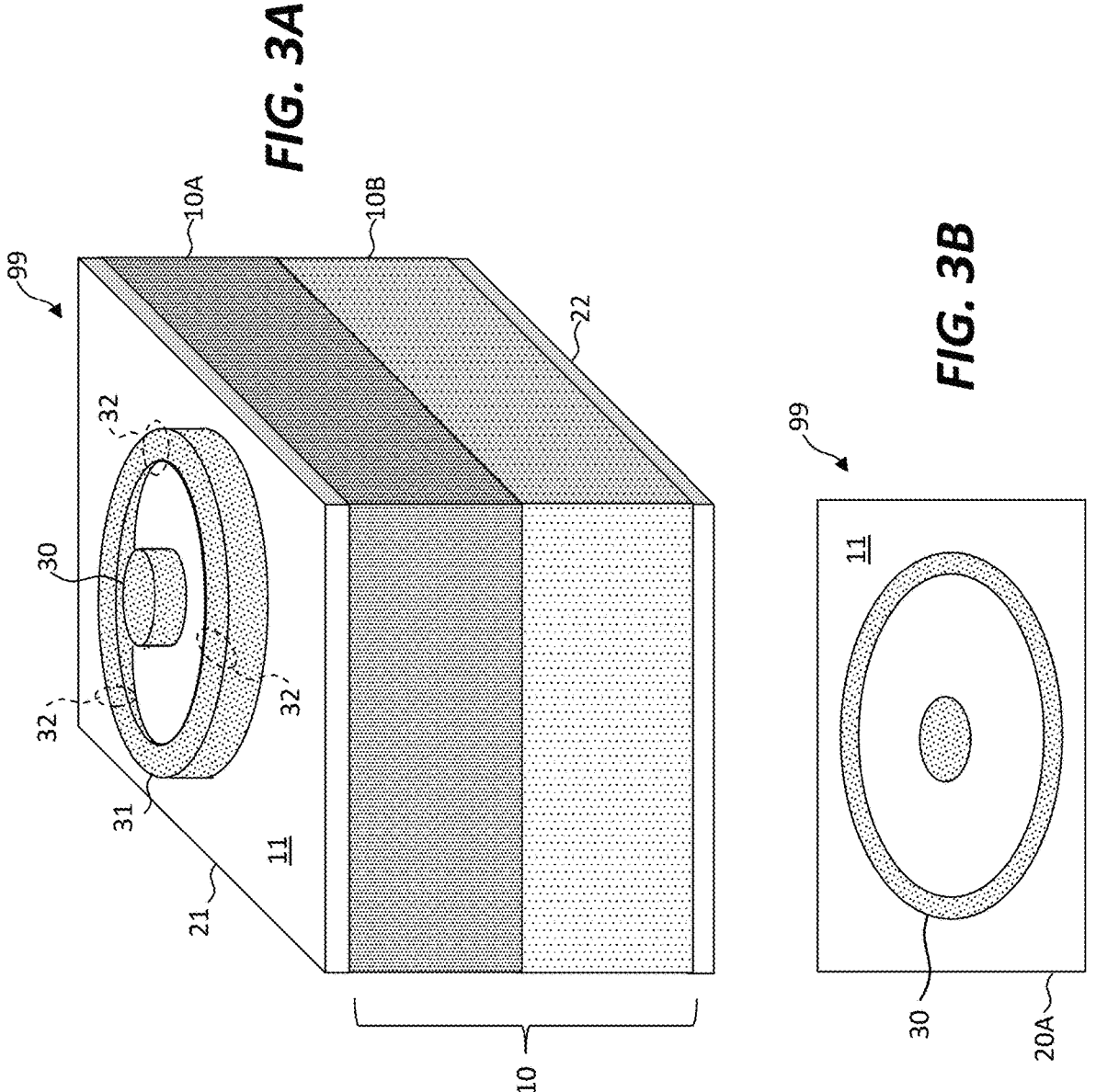
FIG. 3A is a perspective according to illustrative embodiments of the present disclosure.
FIG. 3B is a plan view corresponding to FIG. 3A according to illustrative embodiments of the present disclosure.

The perspective of FIG. 2A and the plan view of FIG. 2B illustrate a first stabilizing connection post 31 that is a linear rail and a second stabilizing connection post 30 that is a pyramid, similar to stabilizing connection posts 30 of FIGS. 1A-1C. First stabilizing connection post 31 extends across component first side 11 and comprises distal portions 32 that are spatially separated and therefore, together with distal portion 32 of second stabilizing connection post 30, provide stability to transfer-print component structure 99 when in contact with a surface. Similarly, FIGS. 3A and 3B illustrate a stabilizing connection post 30 that is a ring with a central cylindrical post having spatially separated distal portions 32 that provide stability to transfer-print component structure 99 when in contact with a surface.

Figure 5:
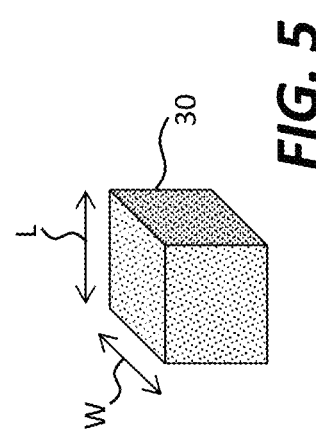
FIGS. 4-7 are perspectives of stabilizing connection posts according to illustrative embodiments of the present disclosure.
Figure 7:
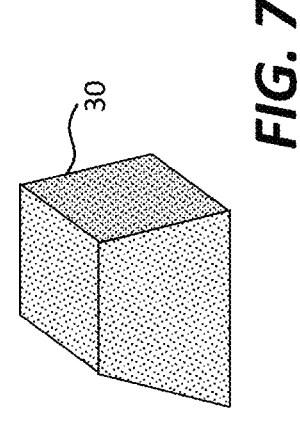
Figure 4:
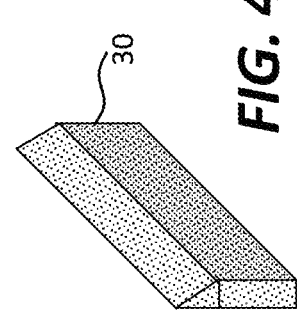
Figure 6:
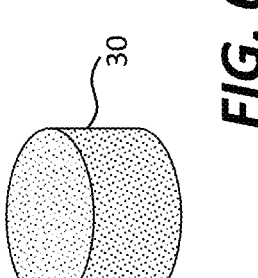

FIGS. 4-7 illustrate embodiments of stabilizing connection posts 30. FIG. 4 shows a linear rail with a distal end that is a sharp, linear edge, FIG. 5 shows a rectangular structure with a substantially square distal end (having a distal length L substantially equal to a distal width W), FIG. 6 shows a cylinder with a substantially circular distal end, and FIG. 7 shows a trapezoidal structure with a substantially square distal end, e.g., a distal end with a distal length that is substantially the same as a distal width (e.g., within 10%). Many other configurations of stabilizing connection posts 30 are possible and any one or more can have a sharp edge or point, for example having a sharp distal end area smaller than a proximal end area (in contact with component first side 11) of stabilizing connection post 30, or a flat distal end. Any two or more stabilizing connection posts 30 can have distal ends or distal portions 32 that are substantially in or terminate in a common plane, providing additional stability to component 10 when stabilizing connection posts 30 are in contact with a surface. In some embodiments, two or more stabilizing connection posts 30 have distal ends that terminate in a common plane. In some embodiments (i) each distal end of the distal ends that terminate in a common plane are substantially a point (e.g., as shown in FIGS. 1A-1C) (ii), each distal end of the distal ends that terminate in a common plane is substantially a plane (e.g., as shown in FIGS. 3A-3B), or (iii) at least one distal end of the distal ends that terminate in a common plane is substantially a point and at least one distal end of the distal ends that terminate in a common plane is substantially a plane (e.g., as shown in FIGS. 2A-2B) or a line (not shown but corresponding to FIG. 4). In some embodiments of the present disclosure, the distal ends are substantially a point, the distal ends are substantially planar or in a plane, or at least one distal end of the distal ends is substantially a point and one distal end of the distal ends is substantially planar or in a plane. Substantially can mean within the limitations of a manufacturing process.

Figure 8B:
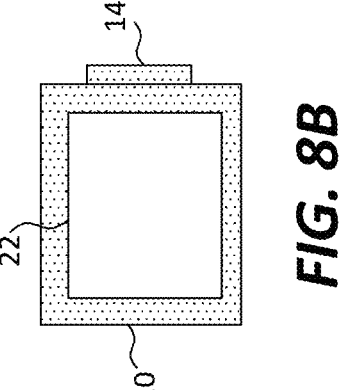
FIG. 8B is a plan view of a stabilizing connection post with at least a portion of a tether corresponding to FIG. 8A according to illustrative embodiments of the present disclosure.
Figure 8A:
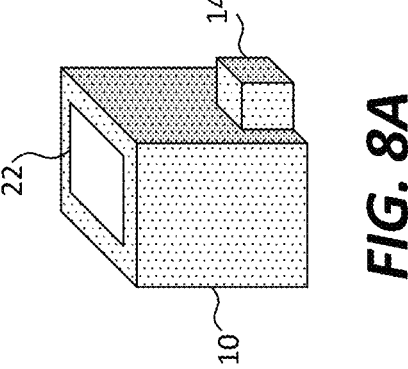
FIG. 8A is a perspective of a stabilizing connection post with at least a portion of a tether according to illustrative embodiments of the present disclosure.

In some embodiments of the present disclosure, component 10 is a vertical LED with two opposing sides (ends, e.g., a top and a bottom or component first side 11 and component second side 12), each with a single electrical connection that can mostly or substantially cover the opposing sides, e.g., covers at least 60%, at least 75%, at least 80% or at least 90% of the corresponding side. For example, and as shown in FIGS. 8A and 8B, single electrode 21 can substantially cover component first side 11 and second electrode 22 can substantially cover component second side 12. Substantially can mean most of (e.g., greater than 50%) or up to effectively all. In some embodiments of the present disclosure, transfer-print component structure 99 can be a micro-transfer printable component and can comprise at least a portion of a tether 14 (e.g., an unbroken or unseparated or broken or separated tether) physically connected to transfer-print component structure 99, such as component 10. Such an at least a portion of a tether 14 can be a result of the construction and micro-transfer printing process used. Tether 14 can be a broken (e.g., fractured) or separated tether 14.

Figure 9:
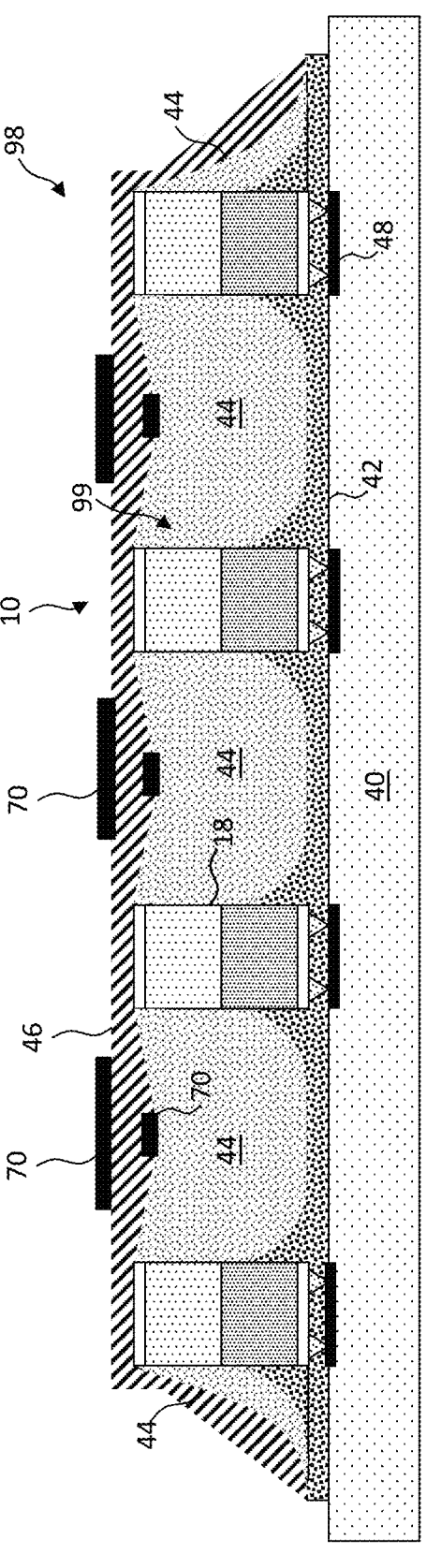
FIG. 9 is a cross section of a transfer-printed structure comprising an array of transfer-print component structures electrically connected to contact pads on a destination substrate and electrically connected together with a common electrode according to illustrative embodiments of the present disclosure.

Multiple components 10 can be integrated into a common system, for example a display system. As shown in FIG. 9, in some embodiments of the present disclosure, a printed structure 98 comprises a destination substrate 40 and at least one electrically conductive contact pad 48 disposed on or in destination substrate 40. One or more transfer-print component structures 99 is disposed on or over destination substrate 40 and at least one of the one or more stabilizing connection posts 30 is in electrical contact with one contact pad 48 of the at least one contact pads 48. Contact pads 48 can be controlled to provide electrical signals to first electrodes 21 of components 10 by an external controller (not shown in the Figures). All of one or more stabilizing connection posts 30 can be in electrical contact with one contact pad 48 of the at least one contact pads 48 to provide an electrical connection between contact pad 48 and component 10.

As shown in FIG. 9, printed structure 98 can comprise a layer of adhesive layer 42 disposed at least partially between component 10 (and component first side 11) and one contact pad 48. At least one stabilizing connection post 30 extends through adhesive layer 42 to make electrical contact with contact pad 48. Component 10 has one or more component walls 18 extending away from destination substrate 40 and adhesive 42 layer can be at least partially in contact with at least a portion of at least one component wall 18. Adhesive 42 layer can be disposed over the entire (or most of) destination substrate 40 or can be disposed in a patterned layer, for example only under transfer-print structures 99 or in the vicinity of transfer-print structures 99 on destination substrate 40. In some embodiments, adhesive 42 layer is a planarization layer 44 and can extend substantially to or near the top of transfer-print structures 99 on a side of transfer-print structures 99 away from destination substrate 40. According to some embodiments, printed structure 98 comprises a planarization layer 44 disposed on or over destination substrate 40 that is at least partially in contact with at least a portion of at least one component wall 18 of transfer-print structures 99. In some embodiments, planarization layer 44 extends to component second side 12. Planarization layer 44 can cover only a portion and less than all of component second side 12 or any electrode (e.g., a second electrode 22) disposed on component second side 12.

According to some embodiments of the present disclosure, each transfer-print component structure 99 comprises a second electrode 22 disposed on component second side 12 and one or more transfer-print component structures 99 comprise a first transfer-print component structure 99 and a second transfer-print component structure 99. Printed structure 98 comprises first and second transfer-print component structures 99 and a common electrode 46 disposed over destination substrate 40 that is in electrical contact with second electrode 22 of first transfer-print component structure 99 and second electrode 22 of second transfer-print component structure 99, so that first and second transfer-print structures 99 are electrically connected in common. In some embodiments, common electrode 46 is directly in contact with component 10 of first and second transfer-print component structures 99 without the use of second electrodes 22. In some embodiments, common electrode 46 and second electrodes 22 comprise or are the same electrically conductive material. Common electrode 46 can contact a planarization layer 44 disposed between one or more transfer-print component structures 99. The presence of a planarization layer 44 can reduce possible discontinuities in common electrode 46 by reducing height differences between common electrode 46 and second electrode 22 over destination substrate 40. Wires 70 can be disposed on planarization layer 44 (e.g., as shown in FIG. 9) or on common electrode 46, or both (as shown), laterally between transfer-print component structures 99 to enhance the conductivity of common electrode 46 without obscuring any light output from transfer-print component structures 99 through common electrode 46. For example, where common electrode 46 comprises indium tin oxide (ITO), wires 70 comprising a metal, such as aluminum having a greater electrical conductivity than ITO, increases the electrical conductivity of common electrode 46, reducing the resistance of common electrode 46 and improving the electrical efficiency of printed structure 98. Wires disposed on planarization layer 44 can be made at the same time as and in a common processing step with second electrode 22 on component 10.

Figures 10A, 10B:
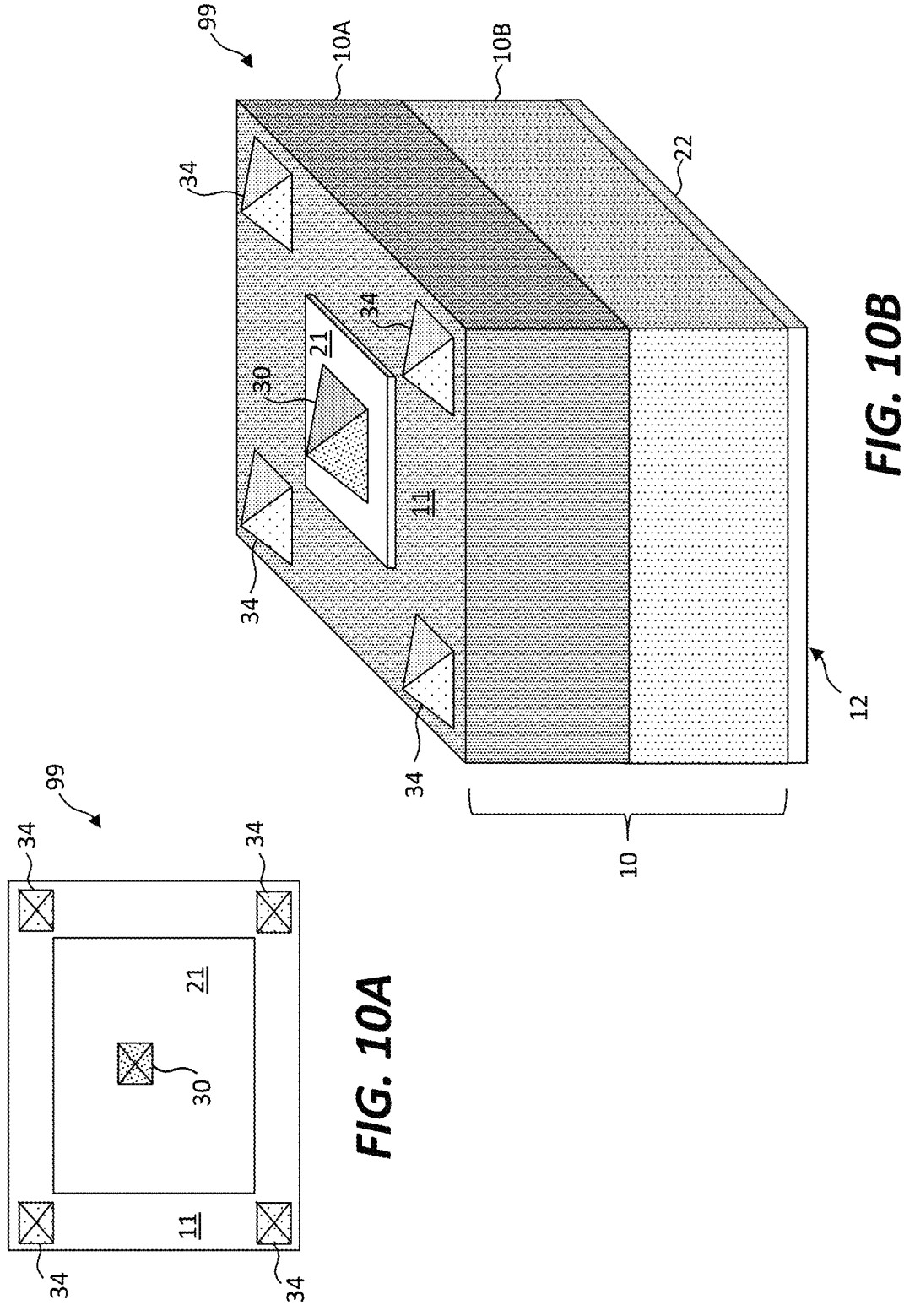
FIGS. 10A and 10B are a plan view and perspective, respectively, of a transfer-print component structure comprising separate stabilizing connection posts according to illustrative embodiments of the present disclosure.
Figure 10C:
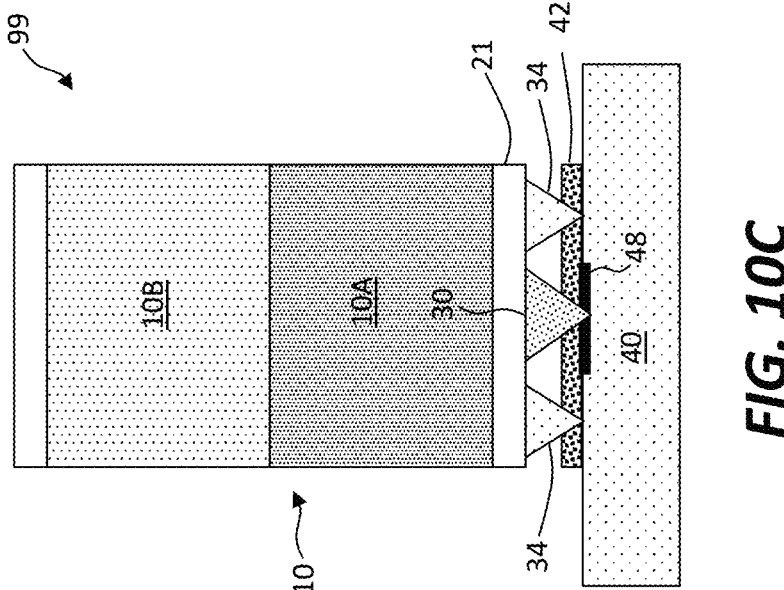
FIG. 10C is a cross section of the transfer-print component structures of FIGS. 10A-10B transfer printed to a destination substrate according to illustrative embodiments of the present disclosure.

According to some embodiments, every electrically conductive stabilizing connection post 30 extending from component first side 11 of component 10 is commonly electrically connected to single electrode 21, for example as shown in FIGS. 1A-1C. In some embodiments and as shown in FIGS. 10A-10C, one or more separate stabilizing connection posts 34 are disposed on component first side 11 and extend away from component 10 to provide stability to transfer-print component structure 99 and component 10 but are not electrically connected in common to single electrode 21. Such a structure can be useful, for example, if contact pad 48 has an area smaller than an area of component 10 over destination substrate 40, as shown in FIG. 10C. For example, such a structure can be useful if limited area is available on destination substrate 40 for contact pads 48, for example for circuits or wiring in a destination substrate 40 with limited wiring layers. In some embodiments, and as shown in FIGS. 10A-10C, separate stabilizing connection posts 34 can be disposed around the perimeter of single electrode 21, component first side 11, or component 10, to accommodate smaller contact pads 48 and provide stability to component 10 when transfer printed to destination substrate 10. As with stabilizing connection posts 30, one or more separate stabilizing connection posts 34 can comprise at least three distal portions or ends disposed at three spatially separated locations that are not in a common line and can comprise structures similar to stabilizing connection posts 30, for example as illustrated in FIGS. 1A-8B.

In some embodiments, as shown in FIG. 10B, separate stabilizing connection posts 34 are not in contact with single electrode 21. In such cases, separate stabilizing connection posts 34 can be electrically conductive, or not. In some embodiments and as shown in FIG. 10C, separate stabilizing connection posts 34 are in contact with single electrode 21 but separate stabilizing connection posts 34 are not electrically conductive and are therefore not in electrical contact with single electrode 21. In some embodiments, stabilizing connection posts 30 have a different height or size from separate stabilizing connection posts 34, for example stabilizing connection posts 30 can be larger or smaller than separate stabilizing connection posts 34 or stabilizing connection posts 30 can be taller or shorter than separate stabilizing connection posts 34. A taller stabilizing connection post 30 can be forced further into contact pads 48 by transfer printing than separate stabilizing connection posts 34. If contact pads 48 have a surface above destination substrate 40, a shorter stabilizing connection post 30 can accommodate the additional thickness of contact pads 48 without preventing separate stabilizing connection posts 34 from contacting destination substrate 40.

According to some embodiments of the present disclosure, transfer-print component structure 99 and component 10 of printed structure 98 comprise or are vertical LEDs.

Figure 11:
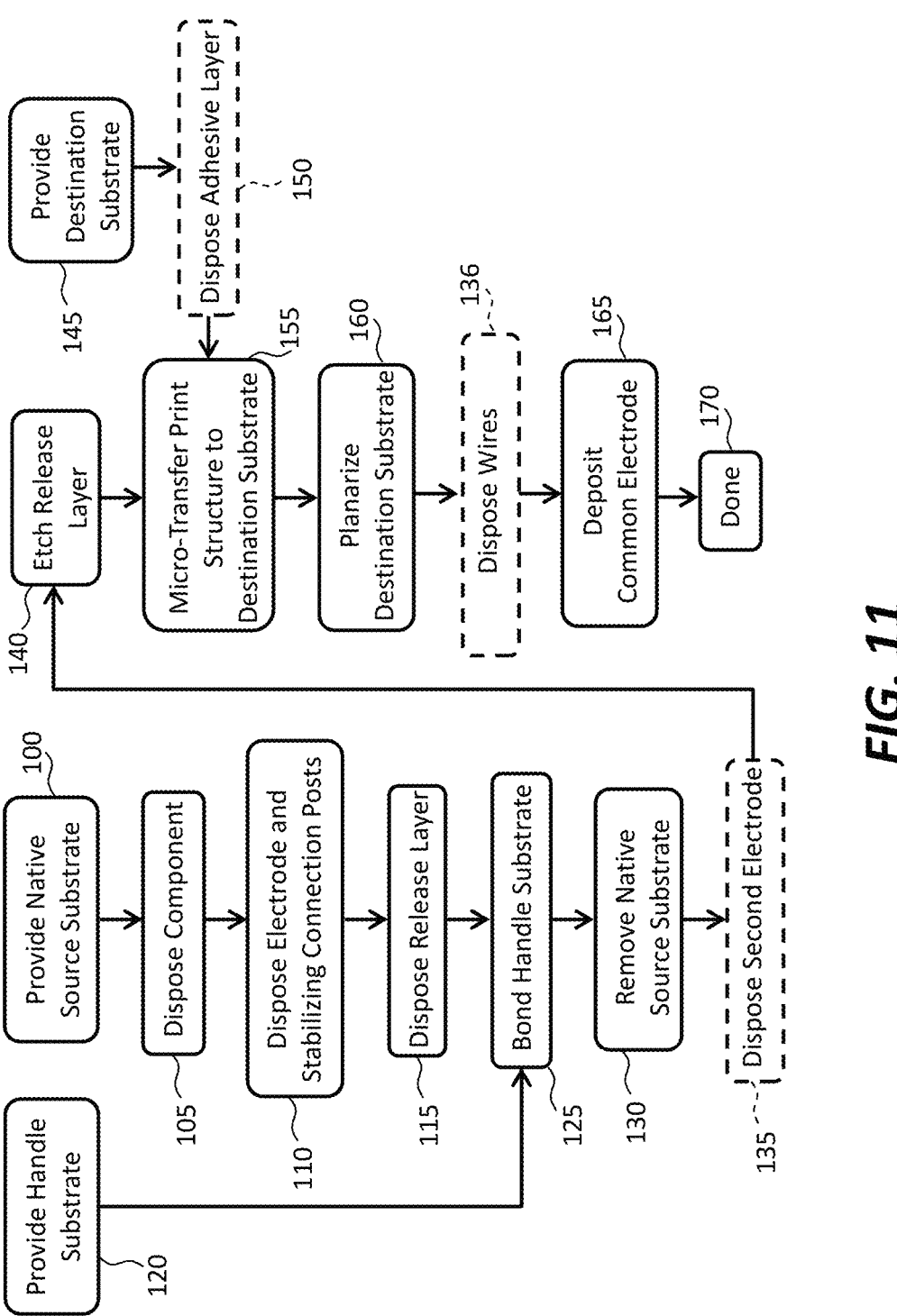
FIG. 11 is a flow diagram according to illustrative methods of the present disclosure.
Figures 12A, 12B, 12C, 12D:
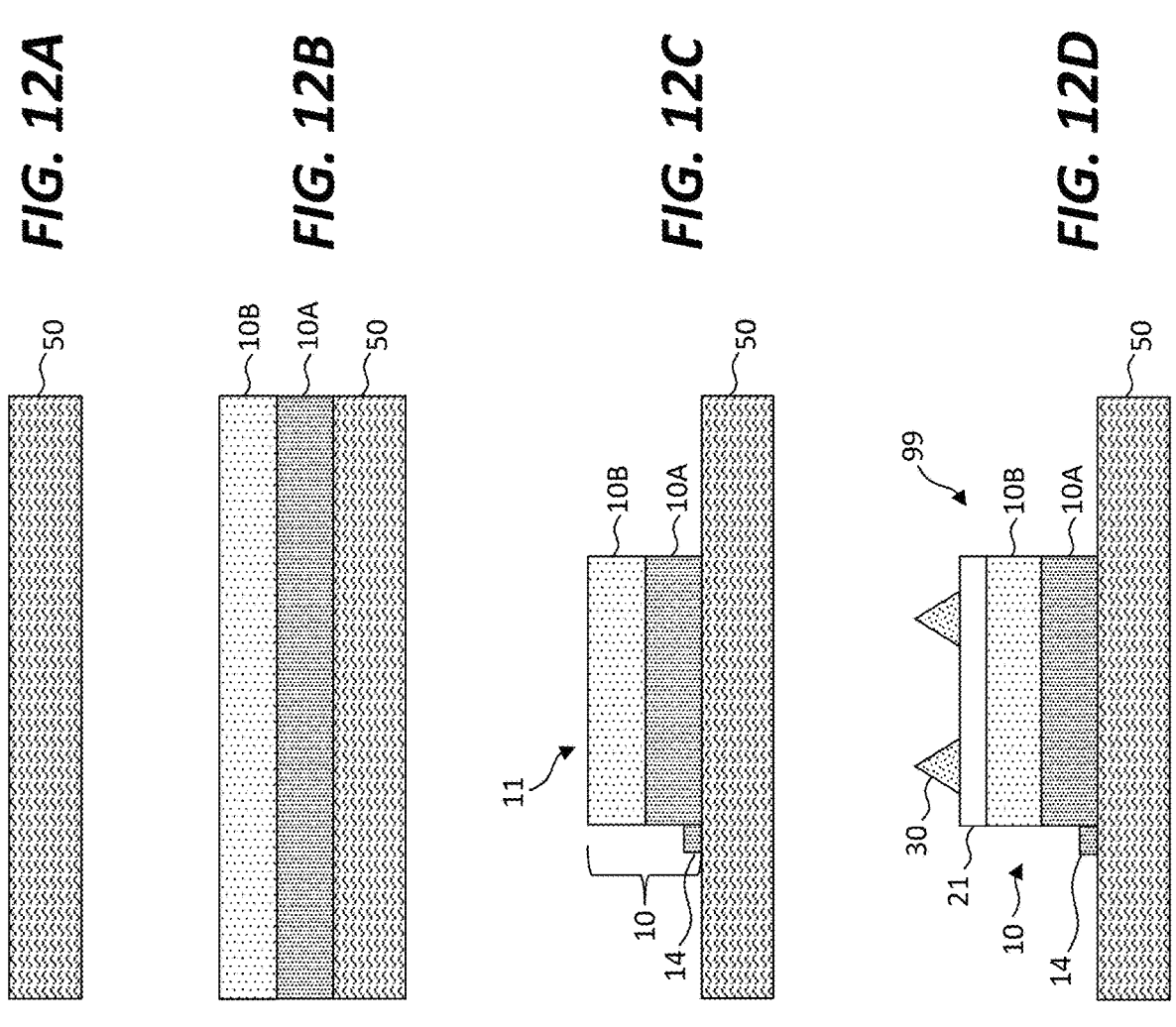
FIG. 12A-12N are successive cross sections illustrating methods of making transfer-print component structures and transfer-printed structures corresponding to FIG. 11 according to illustrative embodiments of the present disclosure.
Figure 12E:
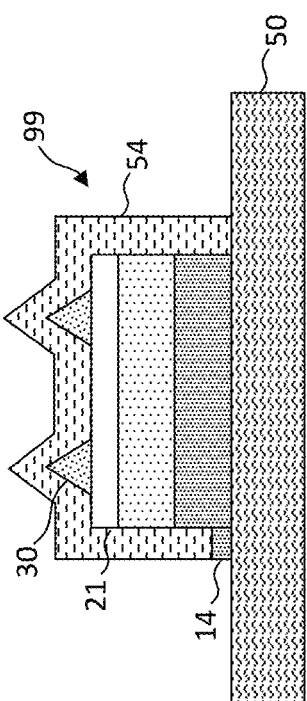
Figure 12F:
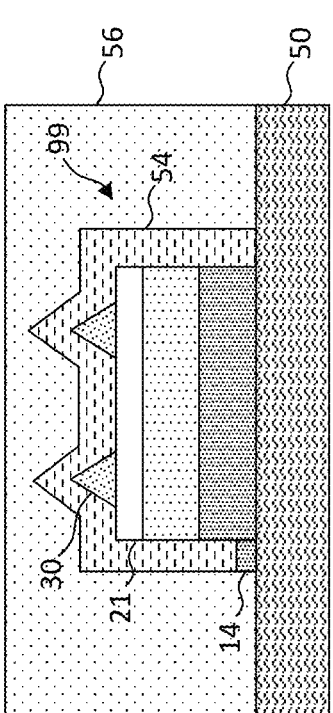
Figures 12G, 12H:
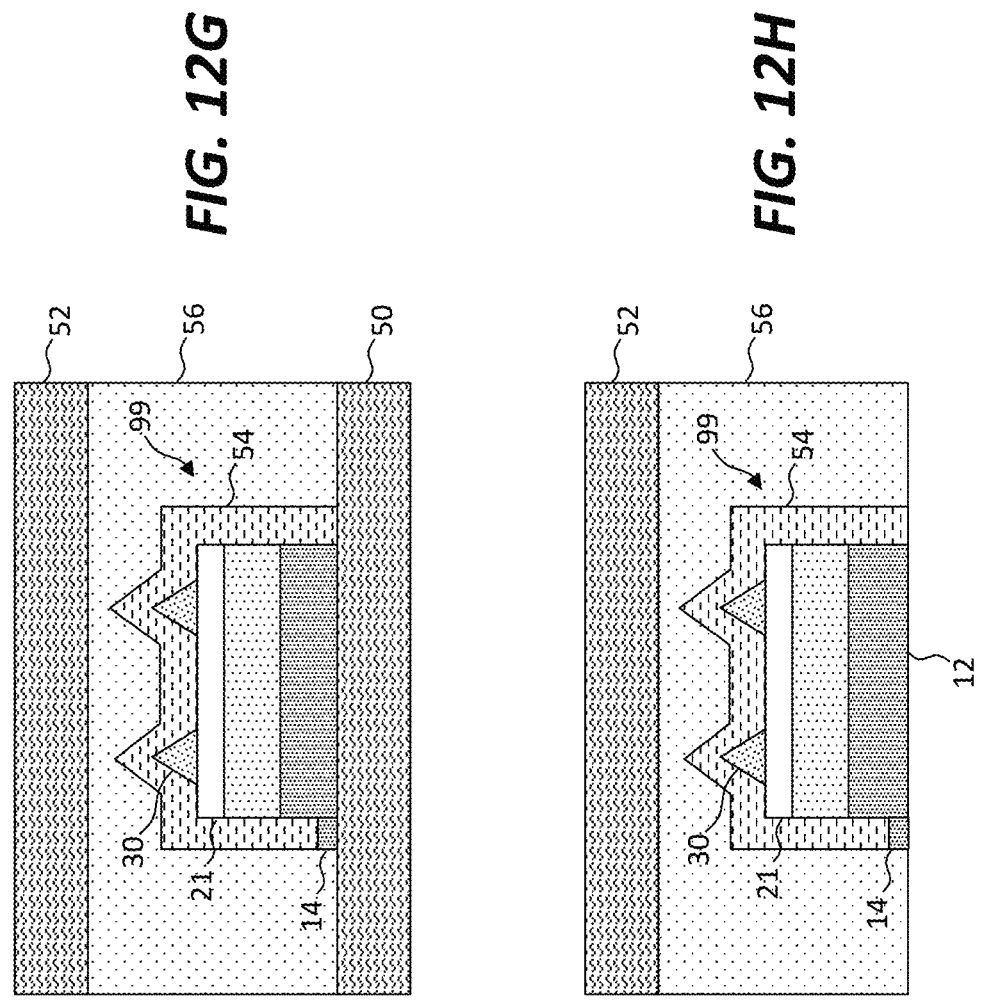
Figures 12I, 12J:
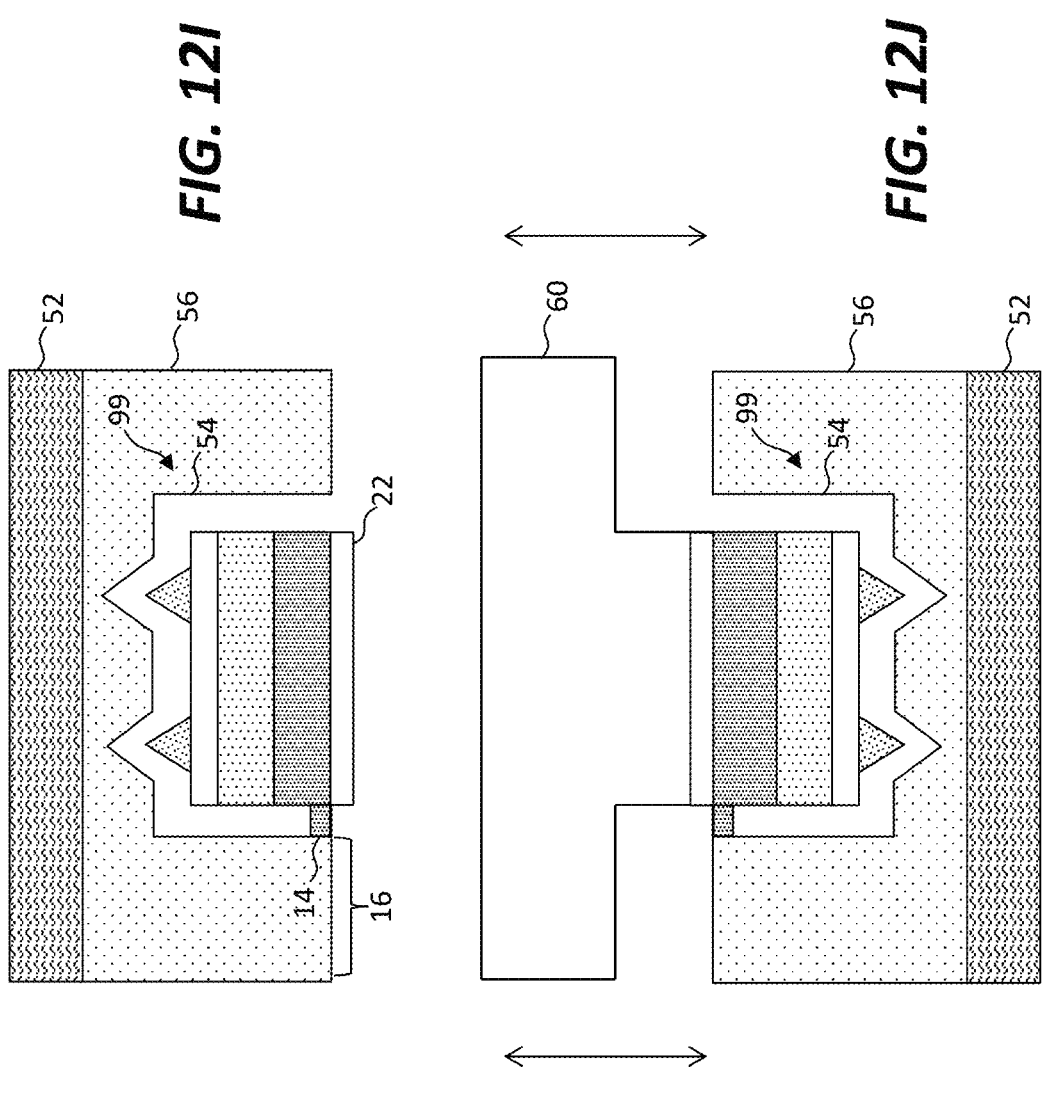
Figures 12K, 12L:
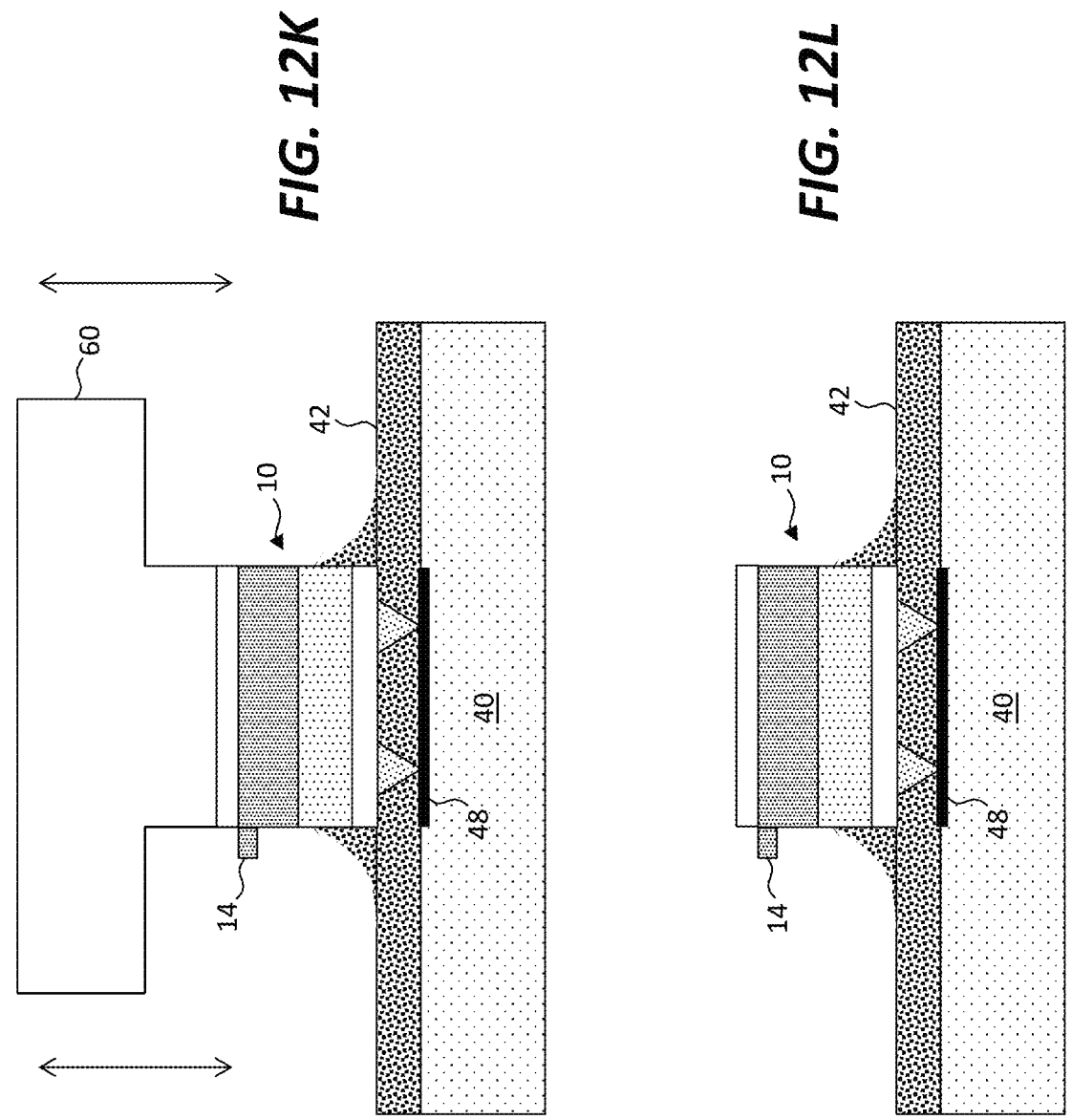
Figure 12M:
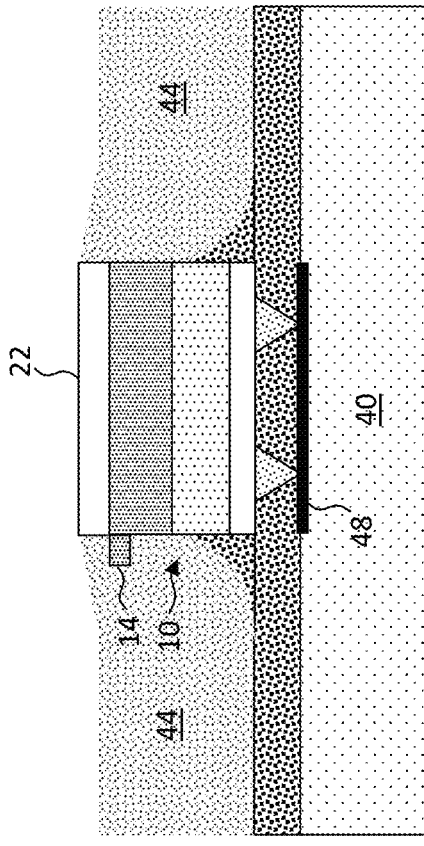
Figure 12N:
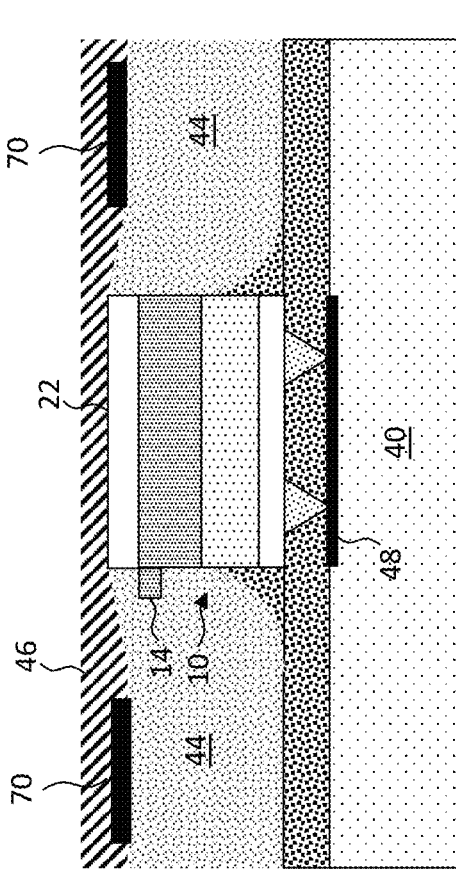

Methods of the present disclosure are illustrated in the flow diagram of FIG. 11 and the successive cross sections of FIGS. 12A-12N. A source wafer or substrate 50 e.g., a native source substrate, is provided in step 100 as shown in FIG. 12A. Any native source substrate can be used to construct embodiments of the present disclosure using any suitable method. Such a source wafer 50 can be, for example, a compound semiconductor wafer, a sapphire wafer, a silicon carbide wafer, or a silicon wafer and can comprise a seed layer. One or more epitaxial layers, e.g., first and second component layers 10A, 10B, are disposed on source wafer 50 as shown in FIG. 12B and patterned, as shown in FIG. 12C to form components 10 in step 105. Such layers can be semiconductor layers such as different compound semiconductor materials or doped compound semiconductor layers, for example doped with p-dopants or n-dopants or implants. Material deposition can be done using photolithographic methods and materials, for example chemical vapor deposition (CVD). Layers together can form a component 10, for example a semiconductor component 10 such as a light-emitting diode or integrated circuit. A tether 14 can be physically connected to component 10 and formed using photolithographic processes and any suitable materials of the process or component 10, for example semiconductor materials, organic or inorganic dielectrics, or metals.

In step 110 and as shown in FIG. 12D, a first electrode 21 can be formed on a process side (e.g., component first side 11) of component 10 opposite source wafer 50 and stabilizing connection posts 30 formed on component first side 11 or first electrode 21 to form a transfer-print component structure 99. The structure of stabilizing connection posts 30 can be formed, for example, by pattern-wise etching component first side 11 or by depositing materials on component first side 11 and patterning the deposited materials, for example by pattern-wise etching the deposited materials. The patterned materials can be semiconductor materials, dielectrics, or metals and can be deposited, for example, by sputtering or evaporation. First electrode 21 can comprise a metal, for example aluminum, silver, gold, tungsten, copper, titanium, or tin, or other conductive material, for example transparent conductive oxides such as indium tin oxide. Thus, as shown in FIG. 12D, according to some embodiments of the present disclosure, a wafer structure comprises a source substrate (e.g., native source wafer 50) and an array of transfer-print component structures 99 disposed laterally over the source substrate. Components 10 of transfer-print component structures 99 can be native to source wafer 50.

As shown in FIG. 12E, a release layer 54 is disposed over component 10, first electrode 21 and component first side 11 in step 115. Suitable release layers 54 can comprise any suitable material that is differentially etchable from component 10, first electrode 21, or stabilizing connection posts 30, for example dielectrics comprising polymers or oxides, and can be deposited by photolithographic methods such as sputtering, coating, or evaporation. Release layer 54 can contact source wafer 50 and tether 14. In some embodiments, release layer 54 does not completely surround component 10. Thus, according to some embodiments of the present disclosure, a wafer structure comprises a release layer 54 disposed on components 10 of transfer-print structures 99 on a side of components 10 opposite source wafer 50.

A handle substrate 52 is provided in step 120 and an adhesive disposed over handle substrate 52 or on release layer 54 and source wafer 50 forming a bonding layer 56, as shown in FIG. 12F, and bonded to handle substrate 52 in step 125 as shown in FIG. 12G. Suitable adhesives include epoxy or a photoresist coated on either handle substrate 52 or component 10 before bonding. In some embodiments, bonding layer 56 contacts source wafer 50 and surrounds component 10 on native source wafer 50. Thus, according to some embodiments of the present disclosure, a wafer structure comprises a handle substrate 52 bonded to at least a portion of release layer 54 with a bonding layer 56.

According to some embodiments of the present disclosure, a wafer structure comprises an array of transfer-print component structures 99, a release layer 54 disposed over each transfer-print component structure 99 of the array of transfer-print component structures 99, and a handle substrate 52 bonded to at least a portion of release layer 54. Release layer 54 can be a gap 54 as the result of etching release layer 54 material and each component 10 and transfer-print component structure 99 of the array of transfer-print component structures 99 is attached to handle substrate 52 with a tether 14 connected to at least one anchor 16. In some embodiments, for each transfer-print component structures 99, at least one anchor 16 is disposed laterally between transfer-print component structures 99 and at least one tether 14 laterally connects transfer-print component structures 99 to the at least one anchor 16. In such embodiments, tethers 14 are connected to a side of transfer-print component structures 99 (as opposed to a top or bottom of transfer-print component structures 99). In some embodiments, for each of transfer-print component structures 99, at least one anchor 16 is disposed between transfer-print component structures 99 and handle substrate 52 and at least one tether 14 connects each transfer-print component structure 99 to at least one anchor 16. In such embodiments, tethers 14 are connected to a bottom of transfer-print component structures 99.

As shown in FIG. 12H, in step 130 source wafer 50 is removed, for example by grinding or laser lift-off, to expose component second side 12 of component 10 and optionally tether 14 and bonding layer 56. Exposed component second side 12 is optionally processed in step 135 to form second electrode 22, for example by photolithographic patterned deposition or deposition and patterning of a conductive material, such as a metal, and etching release layer 54 to form a gap 54 between bonding layer 56 and handle substrate 52 in step 140, leaving component 10 connected by tether 14 to an anchor 16 portion of bonding layer 56 or handle substrate 52 and suspended over (or under) handle substrate 52, as shown in FIG. 12I. In some embodiments, step 140 is done before step 135. FIG. 12J is an inverted illustration of the structure of FIG. 12I with a stamp 60 contacting transfer-print component structure 99 and removing transfer-print component structure 99 from handle substrate 52 and bonding layer 56.

As shown in FIG. 12K, a destination substrate 40 is provided with contact pads 48 in step 145 and optionally coated with an adhesive 42 layer in optional step 150. Destination substrate 40 can be any useful substrate, for example as found in the printed circuit or display industries, such as glass, plastic, or epoxy, and contact pads 48 can be formed using conductive material (such as metal, transparent conductive oxides, or conductive inks), deposition, and patterning methods known in the printed circuit or display industries. Stabilizing connection posts 30 of transfer-print component structure 99 are pressed against contact pads 48 by stamp 60, adhered and electrically connected to contact pads 48, and stamp 60 is removed, leaving transfer-print structure 99 adhered to destination substrate 40, as shown in FIG. 12L, completing micro-transfer printing step 155. Adhesive 42 can be deposited as a liquid and can wick up component walls 18 due to surface tension forces. The flow of adhesive 42 pressures transfer-print structure 99 but, according to some embodiments of the present disclosure, the use of stabilizing connection posts 30 inhibits or mitigates any movement of transfer-print component structure 99 due to such pressure. Adhesive 42 can also be cured, for example by heating, and the curing process can likewise apply pressure to transfer-print structure 99.

In step 160 and as shown in FIG. 12M and FIG. 9, planarization layer 44 is deposited over destination substrate 40 and transfer-print structure 99 on destination substrate 40 and patterned, if necessary, to ensure that second electrode 22 is exposed. Suitable dielectric planarizing layers are known in the photolithographic and integrated circuit arts, for example including polymers such as epoxies and polyimides. According to some embodiments of the present disclosure, planarization layer 44 is cured after deposition, for example by heat. The heat can cure planarization layer 44 but can also cause any adhesive 42 layer to reflow. Thus, the curing step can put pressure on transfer-print component structure 99 but, according to some embodiments of the present disclosure, the presence of stabilizing connection posts 30 inhibits or mitigates any unwanted movement of transfer-print component structure 99, any electrical disconnection between stabilizing connection posts 30 and contact pads 48, or any movement that spatially re-orients transfer-print component structure 99 with respect to destination substrate 40.

In step 165, common electrode 46 is deposited over and in electrical contact with second electrode 22 as shown in FIG. 12N to complete printed structure 98 in step 170. In some embodiments, common electrode 46 is deposited as an unpatterned layer, for example by coating or evaporation. Unpatterned deposition is less expensive than patterning. Common electrode 46 can be a transparent electrode, for example comprising a transparent conductive oxide such as indium tin oxide or polythiophene, and can optionally incorporate an array of conductive metal wires 70 disposed in step 136 on planarization layer 44 or on common electrode 46 (or both, as shown, for example, in FIG. 9) to improve the conductivity of common electrode 46. Conductive metal wires 70 can be formed directly on planarization layer 44 in a common step and in a common layer using common materials and patterning steps with second electrodes 22 where second electrodes 22 are formed after planarization step 160.

Figure 13B:
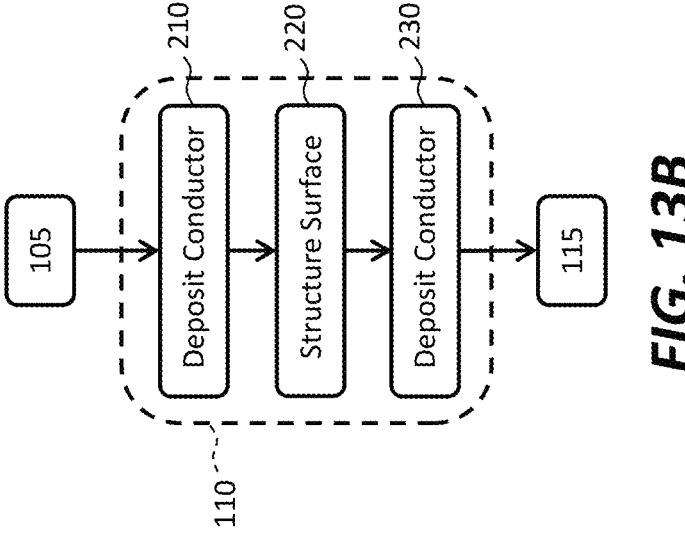
FIGS. 13A and 13B are flow diagrams illustrating methods of the present disclosure.
Figure 13A:
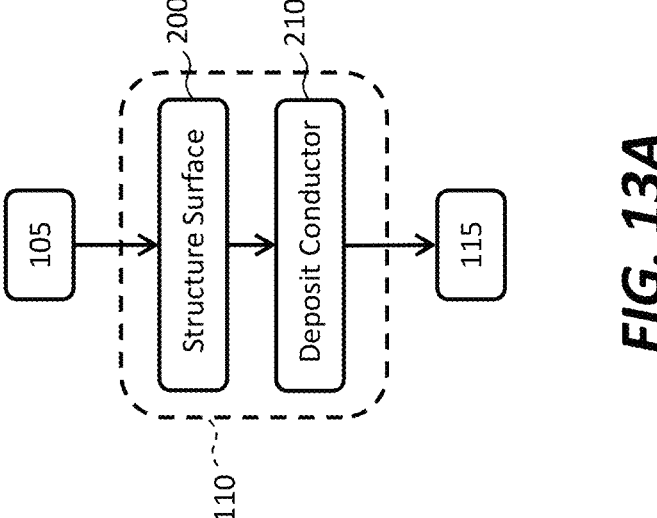

According to some embodiments of the present disclosure, forming stabilizing connection posts 30 in step 110 can be done, for example, as illustrated in the flow diagrams of FIGS. 13A and 13B. Referring to FIG. 13A and the corresponding cross sections of FIGS. 14A and 14B, component first side 11 is processed in step 200, for example by patterned etching of a compound semiconductor material in first component layer 10A by using a mask-exposed photoresist layer deposited on first component layer 10A, etching first component layer 10A, and stripping the photoresist layer, forming a structure on component first side 11. First electrode 21 is then deposited over the structure and component first side 11 to form stabilizing connection posts 30 in step 210.

Figures 14A, 14B, 15A, 15B, 15C:
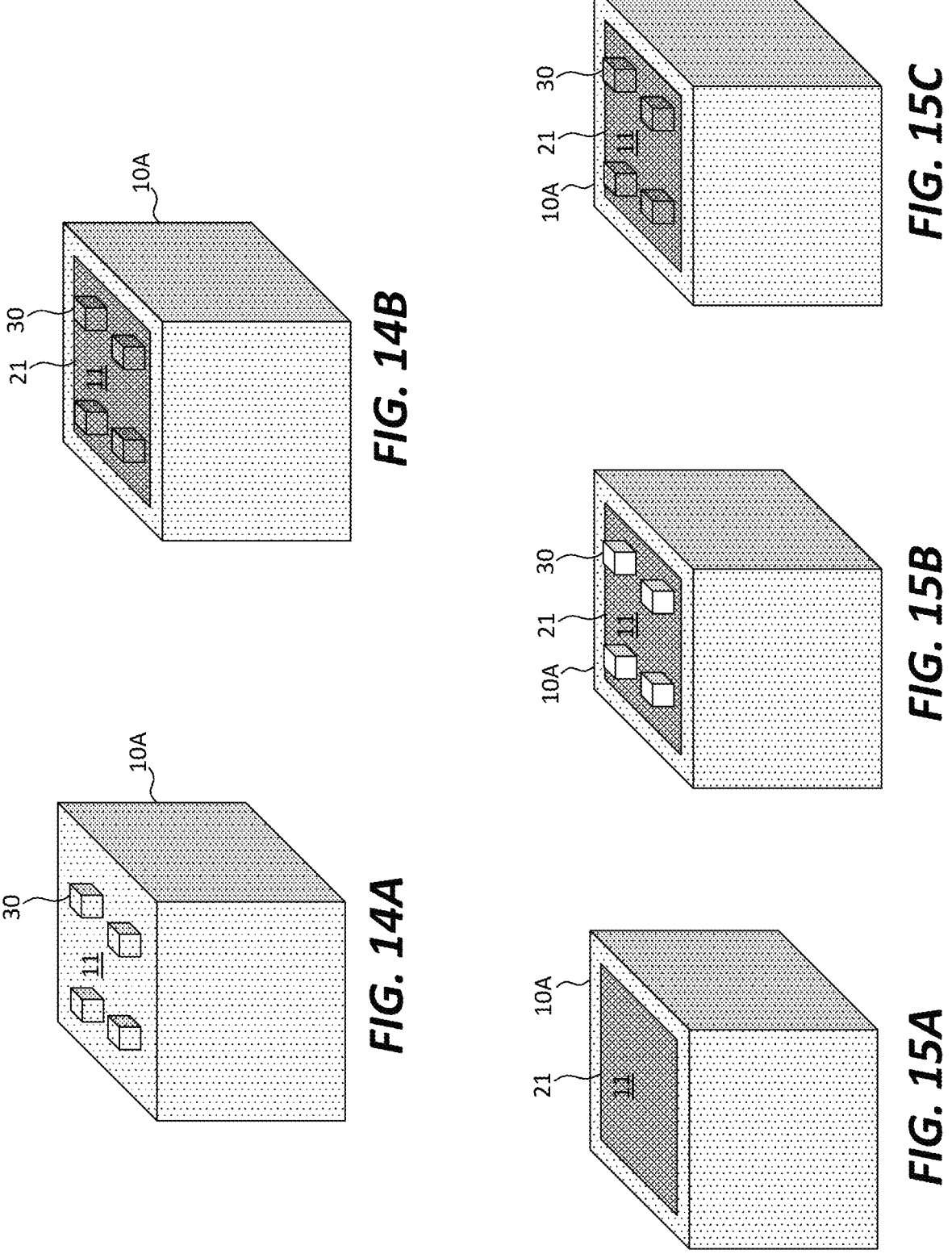
FIGS. 14A and 14B are successive perspectives illustrating the methods of FIG. 13A according to illustrative embodiments of the present disclosure.
FIGS. 15A-15C are successive perspectives illustrating the methods of FIG. 13B according to illustrative embodiments of the present disclosure.

Referring to FIG. 13B and the corresponding cross sections of FIGS. 15A-15C, in step 210, first electrode 21 is deposited as shown in FIG. 15A. The surface of first electrode 21 is then structured, for example by patterned deposition of materials (e.g., metals or dielectrics) in step 220 as shown in FIG. 15B. In step 230, the structured surface is then coated with a conductor, such as a metal and optionally the same conductive material used in step 210, as shown in FIG. 15C, to form stabilizing connection posts 30 on first electrode 21.

According to some embodiments of the present disclosure, a transfer-print component structure 99 comprises a component 10, an electrode (e.g., first electrode 21) disposed on a side (e.g., component first side 11) of component 10, and stabilizing connection posts 30 extending away from the side of component 10. Stabilizing connection posts 30 comprise a first stabilizing connection post 31 that is a rail and a second stabilizing connection post 30 that is a polygonal solid, for example as shown in FIGS. 2A and 2B (where the rail is linear) and 3A and 3B (where the rail is circular). Polygonal solids can include pyramidal or rectangular solids or cylindrical shapes. Each of stabilizing connection posts 30 can be electrically conductive and commonly electrically connected to the electrode (e.g., first electrode 21). First stabilizing connection post 31 and second stabilizing connection post 30 can be the only stabilizing connection posts 30 that extend from a side (e.g., component first side 11) of component 10.

According to some embodiments of the present disclosure, a transfer-print component structure 99 comprises a component 10, an electrode (e.g., first electrode 21) disposed on a side (e.g., component first side 11) of component 10.

Stabilizing connection posts 30 extend away from the side of component 10. Each stabilizing connection post 30 is electrically conductive and electrically connected in common to the electrode. Stabilizing connection posts 30 comprise at least three stabilizing connection posts 30 each having at least a portion that is closer to an edge E of the side of the component 10 than to a center C of the side of component 10, for example as shown in FIG. 1B.

Components 10 formed or disposed in or on component source wafers 50 can be constructed using integrated circuit, micro-electro-mechanical, or photolithographic methods, for example. Components 10 can comprise one or more different component materials, for example non-crystalline (e.g., amorphous), polycrystalline, or crystalline semiconductor materials such as silicon or compound semiconductor materials or non-crystalline or crystalline piezo-electric materials. Materials in components 10 can be doped or undoped and disposed in one or more layers of different, differently processed, or differently doped layers. Components 10 can comprise an oxide or nitride, such as silicon dioxide or silicon nitride or gallium nitride, a group III-V or II-VI semiconductor, or a metal. In certain embodiments, components 10 can be native to and formed on component source wafers 50 (source substrates) and can include seed layers for constructing crystalline layers on or in component source wafers 50. Components 10 can be constructed, for example using photolithographic processes.

Components 10 can be micro-devices having at least one of a length and a width less than or equal to 200 microns, less than or equal to 100 microns, less than or equal to 50 microns, less than or equal to 25 microns, less than or equal to 15 microns, less than or equal to 10 microns, or less than or equal to five microns, and alternatively or additionally a thickness of less than or equal to 50 microns, less than or equal to 25 microns, less than or equal to 15 microns, less than or equal to 10 microns, less than or equal to five microns, less than or equal to two microns, or less than or equal to one micron. Transfer-print component structures 99 can be unpackaged dice (each an unpackaged die).

Destination substrate 40 can be any destination substrate or target substrate to which components 10 are transferred (e.g., micro-transfer printed), for example flat-panel display substrates, printed circuit boards, or similar substrates and can be used in various embodiments or applications. Patterned destination substrates 40 can be, for example substrates comprising one or more of glass, polymer, quartz, ceramics, metal, and sapphire. Destination substrates 40 can be semiconductor substrates (for example silicon) or compound semiconductor substrates.

Patterned electrical conductors (e.g., wires, traces, electrodes, or electrical contact pads 48) such as those found on printed circuit boards, flat-panel display substrates, and in thin-film circuits) can be formed on any combination of components 10, transfer-print component structures 99, and destination substrate 40, and any one can comprise electrodes (e.g., electrical contact pads) that electrically connect to components 10 or transfer-print component structures 99 through contact pads 48. Such patterned electrical conductors, electrodes, or contact pads 48 can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on destination substrate 40.

Examples of micro-transfer printing processes suitable for disposing components 10 onto patterned destination substrates 40 are described in "Inorganic light-emitting diode displays using micro-transfer printing" (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. Pat. No. 10,103,069 entitled Pressure Activated Electrical Interconnection by Micro-Transfer Printing, U.S. Pat. No. 8,889,485 entitled Methods for Surface Attachment of Flipped Active Components, U.S. Pat. No. 10,468,363 entitled Chiplets with Connection Posts, U.S. Pat. No. 10,224,460 entitled Micro-Assembled LED Displays and Lighting Elements, and U.S. Pat. No. 10,153, 256, entitled Micro-Transfer Printable LED Component, the disclosure of each of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety.

Components 10 and transfer-print component structures 99, in certain embodiments, can be constructed using foundry fabrication processes used in the art. Layers of materials can be used, including materials such as metals, oxides, nitrides and other materials used in the integrated-circuit art. Each component 10 or transfer-print component structure 99 can be or include a complete semiconductor integrated circuit and can include, for example, any combination of one or more of a transistor, a diode, a light-emitting diode, and a sensor. Components 10 and transfer-print component structures 99 can have different sizes, for example, at least 100 square microns, at least 1,000 square microns, at least 10,000 square microns, at least 100,000 square microns, or at least 1 square mm. Alternatively or additionally, components 10 and transfer-print component structures 99 can be no more than 100 square microns, no more than 1,000 square microns, no more than 10,000 square microns, no more than 100,000 square microns, or no more than 1 square mm, for example. Components 10 and transfer-print component structures 99 can have variable aspect ratios, for example between 1:1 and 10:1 (e.g., at least 1:1, at least 2:1, at least 5:1, and, optionally, no more than 10:1). Components 10 and transfer-print component structures 99 can be rectangular, cylindrical, or can have other shapes, such as polygonal or circular shapes for example.

Various embodiments of structures and methods are described herein. Structures and methods are variously described as transferring components 10 and transfer-print component structures 99, printing components 10 and transfer-print component structures 99, or micro-transferring components 10 and transfer-print component structures 99. Micro-transfer-printing involves using a transfer device (e.g., an elastomeric stamp 60, such as a PDMS stamp 60) to transfer a component 10 or transfer-print component structure 99 using controlled adhesion. For example, an exemplary transfer device can use kinetic or shear-assisted control of adhesion between a transfer device and a component 10 or transfer-print component structure 99. It is contemplated that, in certain embodiments, where a method is described as including micro-transfer-printing a component 10 or transfer-print component structure 99, other analogous embodiments exist using a different transfer method. As used herein, transferring a component 10 or transfer-print component structure 99 can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a component 10 or transfer-print component structure 99.

As is understood by those skilled in the art, the terms "over" and "under" or "top" and "bottom" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line/direction
C center
D1 distance
D2 distance
E edge
L distal length
W distal width
10 component
10A first component layer
10B second component layer
11 component first side 12 component second side
14 tether
16 anchor
18 component wall
21 single electrode/first electrode
22 second electrode
30 stabilizing connection post/second stabilizing connection post
31 first stabilizing connection post
32 distal portion/distal end
34 separate stabilizing connection post
40 destination substrate
42 adhesive
44 planarization layer
46 common electrode
48 contact pad
50 native source wafer
52 handle substrate
54 release layer/gap
56 bonding layer
60 stamp
70 wire
98 printed structure
99 transfer-print component structure
100 provide native source substrate step
105 dispose component step
110 dispose electrode and stabilizing connection posts step
115 dispose release layer step
120 provide handle substrate step
125 bond handle substrate step
130 remove native substrate step
135 dispose second electrode step
136 dispose wires step
140 etch release layer step
145 provide destination substrate step
150 optional dispose adhesive layer step
155 micro-transfer print structure to destination substrate step
160 planarize destination substrate step
165 deposit common electrode step
170 done step
200 structure surface step
210 deposit conductor step
220 structure surface step
230 deposit conductor step

What is claimed:

1. A transfer-print component structure, comprising:
a component having a component first side and an opposing component second side;
a single, substantially planar, and continuous electrode disposed on the component first side, wherein the single electrode is the only electrode disposed on the component first side; and
exactly three stabilizing connection posts disposed on the component first side and extending away from the component such that the three stabilizing connection posts protrude from the component first side, wherein each of the three stabilizing connection posts is electrically conductive and is electrically connected in common to the single electrode, wherein
the three stabilizing connection posts are disposed at three spatially separated locations that are not in a common line,
the three stabilizing connection posts are closer to an edge of the component first side than to a center of the component first side, each of the three stabilizing connection posts comprises a sharp distal end with a sharp distal end area that is smaller than a proximal end area of the stabilizing connection post, and
the three sharp distal ends define a common plane such that the component is in electrical contact with a contact pad on a target substrate only the distal ends of the three connection posts contact the contact pad on the target substrate.

2. The transfer-print component structure of claim 1, wherein the three stabilizing connection posts comprise a stabilizing connection post with a distal end that is a linear rail with a length greater than a width, a curved rail with a length greater than a width, or a ring that is any simple closed curve.

3. The transfer-print component structure of claim 1, wherein the three stabilizing connection posts comprise a stabilizing connection post having a distal end with a distal length and a distal width, and the distal length is substantially the same as the distal width.

4. The transfer-print component structure of claim 1, wherein the three stabilizing connection posts comprise a stabilizing connection post having a flat distal end surface.

5. The transfer-print component structure of claim 1, wherein the three stabilizing connection posts comprise distal ends that terminate in a common plane parallel to the single electrode disposed on the component first side.

6. The transfer-print component structure of claim 5, wherein (i) each distal end of the distal ends that terminate in a common plane are substantially a point (ii), each distal end of the distal ends that terminate in a common plane is substantially a plane, or (iii) at least one distal end of the distal ends that terminate in a common plane is substantially a point and at least one distal end of the distal ends that terminate in a common plane is substantially a plane.

7. The transfer-print component structure of claim 1, wherein the component comprises a vertical LED or the transfer-print component structure is a vertical LED.

8. The transfer-print component structure of claim 1, wherein the single electrode disposed on the component first side substantially covers the component first side.

9. The transfer-print component structure of claim 1, comprising at least a portion of a tether physically connected to the component.

10. The transfer-print component structure of claim 1, further comprising one or more separate stabilizing connection posts protruding from the component first side and electrically disconnected from the single electrode.

11. The transfer-print component structure of claim 10, wherein the three separate stabilizing connection posts are disposed around a perimeter of the single electrode or the component first side or wherein at least one separate stabilizing connection post of the three separate stabilizing connection posts is closer to an edge of the single electrode or the component first side than at least one stabilizing connection post of the three stabilizing connection posts electrically connected in common to the single electrode.

12. The transfer-print component structure of claim 1, comprising a second electrode disposed exclusively on the component second side.

13. The transfer-print component structure of claim 1, comprising a destination substrate and a continuous contact pad disposed on the destination substrate, wherein the exactly three stabilizing connection posts are disposed in electrical contact with the continuous contact pad.

14. The transfer-print component structure of claim 13, comprising an adhesive disposed on the destination substrate that adheres the component to the destination substrate.

15. The transfer-print component structure of claim 13, wherein the single electrode is a first electrode, the component comprises a second electrode disposed on the component second side, and the component structure comprises a plurality of components and a common electrode disposed over the plurality of components opposite the destination substrate in electrical contact with the second electrode of each of the plurality of components.

16. The transfer-print component structure of claim 1, wherein the plane is substantially parallel to the single electrode.

17. The transfer-print component structure of claim 1, wherein the three stabilizing connection posts comprise a stabilizing connection post with a distal end that is a linear rail with a length greater than a width or a curved rail with a length greater than a width.

18. A transfer-print component structure, comprising:
a component;
a substantially planar and continuous electrode disposed on a side of the component; and
stabilizing connection posts extending away and protruding from the side of the component, wherein
the stabilizing connection posts comprise a first stabilizing connection post having a distal end that is a linear rail with a length greater than a width or a curved rail that is not a closed ring and has a length greater than a width, and a second stabilizing connection post that is a polygonal solid,
the stabilizing connection posts comprise three distal portions disposed at three spatially separated locations that are not in a common line,
the three distal portions are closer to an edge of the component first side than to a center of the component first side,
the stabilizing connection posts comprise a stabilizing connection post having a sharp distal end area smaller than a proximal end area of the stabilizing connection post, and
the three distal portions define a common plane such that the component is in electrical contact with a contact pad on a target substrate only the three distal portions contact the contact pad on the target substrate.

19. The transfer-print component structure of claim 18, wherein each of the stabilizing connection posts is electrically conductive and commonly electrically connected to the continuous electrode.

20. The transfer-print component structure of claim 18, wherein the first stabilizing connection post and the second stabilizing connection post are the only stabilizing connection posts that extend from the side of the component.

21. The transfer-print component structure of claim 18, wherein every stabilizing connection post extending from the first side of the component is commonly electrically connected to the single electrode.

22. The transfer-print component structure of claim 18, wherein the plane is substantially parallel to the electrode.

23. A transfer-print component structure, comprising:
a component;
a substantially planar and continuous single electrode disposed on a side of the component; and
one or more stabilizing connection posts extending away and protruding from the side of the component, wherein
each of the stabilizing connection posts is electrically conductive and is electrically connected in common to the single electrode,
the one or more stabilizing connection posts comprise a distal end that is any one or more of a linear rail with a length greater than a width or a curved rail that is not a closed ring with a length greater than a width,
the one or more stabilizing connection posts comprise three distal portions disposed at three spatially separated locations that are not in a common line,
the three distal portions are closer to an edge of the component first side than to a center of the component first side,
the one or more stabilizing connection posts comprise a stabilizing connection post having a sharp distal end area smaller than a proximal end area of the stabilizing connection post, and
the three distal portions define a common plane such that the component is in electrical contact with a contact pad on a target substrate only the three distal portions contact the contact pad on the target substrate.

24. The transfer-print component structure of claim 23, wherein the plane is substantially parallel to the single electrode.

* * * * *